United States Patent
Shinagawa et al.

(10) Patent No.: US 9,209,931 B2
(45) Date of Patent: Dec. 8, 2015

(54) DEVICE AND METHOD FOR TRANSMISSION, DEVICE AND METHOD FOR RECEPTION, AND PROGRAM

(75) Inventors: Masashi Shinagawa, Tokyo (JP); Makoto Noda, Tokyo (JP)

(73) Assignee: Sony Corporation, Tokyo (JP)

(*) Notice: Subject to any disclaimer, the term of this patent is extended or adjusted under 35 U.S.C. 154(b) by 658 days.

(21) Appl. No.: 12/934,159

(22) PCT Filed: Apr. 2, 2009

(86) PCT No.: PCT/JP2009/056881
§ 371 (c)(1),
(2), (4) Date: Sep. 23, 2010

(87) PCT Pub. No.: WO2009/123280
PCT Pub. Date: Oct. 8, 2009

(65) Prior Publication Data
US 2011/0029838 A1    Feb. 3, 2011

(30) Foreign Application Priority Data
Apr. 2, 2008 (JP) .............................. P2008-096273

(51) Int. Cl.
*H03M 13/00*    (2006.01)
*H04L 1/00*    (2006.01)
(Continued)

(52) U.S. Cl.
CPC ............ *H04L 1/001* (2013.01); *H03M 13/09* (2013.01); *H03M 13/35* (2013.01); *H04L 1/007* (2013.01); *H04L 1/0072* (2013.01)

(58) Field of Classification Search
CPC ....... H04L 1/001; H03M 13/35; H03M 13/09

USPC .......................................... 714/774, 781, 780
See application file for complete search history.

(56) References Cited

U.S. PATENT DOCUMENTS 4,763,332 A * 8/1988 Glover .......................... 714/756
5,155,487 A * 10/1992 Tanaka et al. .................. 341/100
(Continued)

FOREIGN PATENT DOCUMENTS

| JP | 10-233700 | 9/1998 |
| JP | 2002-519905 | 7/2002 |
| JP | 2006-180172 | 7/2006 |

OTHER PUBLICATIONS

P. Koopman, et al., "Cyclic Redundancy Code (CRC) Polynomial Selection for Embedded Networks", Proceedings of the 2004 International Conference on Dependable Systems and Networks, pp. 145-154 (2004).

(Continued)

*Primary Examiner* — Joseph D Torres
(74) *Attorney, Agent, or Firm* — Paratus Law Group, PLLC

(57) ABSTRACT

The present invention relates to a device and a method for transmission, a device and a method for reception, and a program that make it possible to obtain an undetected error probability characteristic close to a limit value in a system using a CRC for a plurality of pieces of data having different code lengths. A generator polynomial for header data which generator polynomial is used when a CRC coding process is performed on header data and a generator polynomial for sub-header data which generator polynomial is used when the CRC coding process is performed on sub-header data are set in a transmitting device. The transmitting device selects a generator polynomial according to data set as an object of the CRC coding process.

6 Claims, 22 Drawing Sheets

(51) Int. Cl.
*H03M 13/35* (2006.01)
*H03M 13/09* (2006.01)

(56) References Cited

U.S. PATENT DOCUMENTS

| | | | | |
|---|---|---|---|---|
| 5,282,215 | A * | 1/1994 | Hyodo et al. | 714/775 |
| 5,426,654 | A * | 6/1995 | Hayashi et al. | 714/781 |
| 6,085,349 | A | 7/2000 | Stein | |
| 6,192,498 | B1 * | 2/2001 | Arato | 714/781 |
| 6,212,660 | B1 * | 4/2001 | Joeressen et al. | 714/758 |
| 6,530,057 | B1 * | 3/2003 | Kimmitt | 714/758 |
| 6,674,807 | B1 * | 1/2004 | Park et al. | 375/265 |
| 6,681,364 | B1 * | 1/2004 | Calvignac et al. | 714/776 |
| 6,684,363 | B1 * | 1/2004 | Cassiday et al. | 714/776 |
| 6,701,478 | B1 * | 3/2004 | Yang et al. | 714/757 |
| 6,732,317 | B1 * | 5/2004 | Lo | 714/757 |
| 6,732,318 | B2 * | 5/2004 | Collier et al. | 714/758 |
| 6,763,495 | B2 * | 7/2004 | Suzuki et al. | 714/781 |
| 6,804,188 | B1 * | 10/2004 | Shishido et al. | 369/275.3 |
| 6,810,501 | B1 * | 10/2004 | Ferguson et al. | 714/781 |
| 6,820,228 | B1 * | 11/2004 | Keller | 714/757 |
| 6,848,072 | B1 * | 1/2005 | Milliken | 714/781 |
| 6,910,172 | B2 * | 6/2005 | Hara et al. | 714/757 |
| 6,931,581 | B1 * | 8/2005 | Cassiday et al. | 714/758 |
| 6,934,902 | B2 * | 8/2005 | Hara et al. | 714/757 |
| 6,938,197 | B2 * | 8/2005 | Doubler et al. | 714/757 |
| 6,961,893 | B1 * | 11/2005 | Mukund et al. | 714/781 |
| 6,988,161 | B2 * | 1/2006 | McConnell et al. | 710/316 |
| 7,028,244 | B2 * | 4/2006 | Milliken | 714/781 |
| 7,162,675 | B2 * | 1/2007 | Das et al. | 714/751 |
| 7,191,383 | B2 * | 3/2007 | Lin et al. | 714/774 |
| 7,246,303 | B2 * | 7/2007 | Bansal et al. | 714/800 |
| 7,249,306 | B2 * | 7/2007 | Chen | 714/758 |
| 7,290,196 | B1 * | 10/2007 | Annayya et al. | 714/758 |
| 7,320,102 | B2 * | 1/2008 | Milliken | 714/781 |
| 7,363,573 | B1 * | 4/2008 | Bataineh | 714/758 |
| 7,428,693 | B2 * | 9/2008 | Obuchi et al. | 714/804 |
| RE40,684 | E * | 3/2009 | Keller | 714/757 |
| 7,523,305 | B2 * | 4/2009 | Skovira | 713/160 |
| 7,546,512 | B2 * | 6/2009 | Ranjan et al. | 714/758 |
| 7,571,370 | B2 * | 8/2009 | Ridgeway et al. | 714/758 |
| 7,590,916 | B2 * | 9/2009 | Katashita et al. | 714/757 |
| 7,761,776 | B1 * | 7/2010 | Bataineh | 714/774 |
| 2002/0046370 | A1 * | 4/2002 | Cordero | 714/48 |
| 2002/0053059 | A1 * | 5/2002 | Hara et al. | 714/758 |
| 2004/0194000 | A1 * | 9/2004 | Lin et al. | 714/776 |
| 2006/0153179 | A1 * | 7/2006 | Ho et al. | 370/386 |
| 2008/0002567 | A1 * | 1/2008 | Bourlas et al. | 370/208 |
| 2008/0320370 | A1 * | 12/2008 | Shinagawa et al. | 714/777 |
| 2010/0031124 | A1 * | 2/2010 | Shinagawa et al. | 714/777 |

OTHER PUBLICATIONS

International Search Report from the Japanese Patent Office for International Application No. PCT/JP2009/056881 (Apr. 28, 2009).

* cited by examiner

FIG. 14

| Index | G(x) | w | Index | G(x) | w |
|---|---|---|---|---|---|
| A1 | 13613 | 8 | A18 | 14825 | 6 |
| A2 | 13D65 | 10 | A19 | 13019 | 6 |
| A3 | 1AD77 | 12 | A20 | 1F29F | 12 |
| A4 | 169FD | 12 | A21 | 15295 | 8 |
| A5 | 15643 | 8 | A22 | 1AB27 | 10 |
| A6 | 1CE17 | 10 | A23 | 1A82B | 8 |
| A7 | 128CD | 8 | A24 | 11291 | 6 |
| A8 | 15D8B | 10 | A25 | 14FCB | 11 |
| A9 | 10E63 | 8 | A26 | 1815F | 9 |
| A10 | 17ADB | 12 | A27 | 183B3 | 9 |
| A11 | 1C447 | 8 | A28 | 168F7 | 11 |
| A12 | 1797D | 12 | A29 | 1A37B | 11 |
| A13 | 1DEF7 | 14 | A30 | 154AD | 9 |
| A14 | 16F57 | 12 | A31 | 10DE5 | 9 |
| A15 | 18443 | 6 | A32 | 136F3 | 11 |
| A16 | 11C71 | 8 | A33 | 1056F | 9 |
| A17 | 12AA9 | 8 | A34 | 1B39B | 11 |

FIG.15

| n | G(x) |
|---|---|
| 36 | A6, A25-A29, A31-A34 |
| 37 | A6, A11, A22, A25-A34 |
| 38 | A6, A7, A11, A22, A25-A34 |
| 39 | A2, A6, A7, A11, A15, A22, A25-A34 |
| 40 | A2, A5-A7, A9, A11, A15-A17, A21, A22, A25-A34 |
| 41 | A2, A5-A7, A9, A11, A15-A17, A19, A21, A22, A25-A34 |
| 42-47 | A2, A5-A7, A9, A11, A15-A17, A19, A21, A22, A24-A34 |
| 48-52 | A2, A4, A6, A7, A9, A11, A15-A17, A19, A21, A22, A24-A34 |
| 53-54 | A2, A6, A7, A9, A11, A15-A17, A19, A21, A22, A24-A34 |
| 55 | A2, A6, A7, A9, A11, A15-A17, A19-A22, A24-A34 |
| 56 | A2, A6, A7, A9, A11, A15-A17, A19-A22, A24-A34 |
| 57 | A2, A7, A9, A11, A15-A17, A19-A22, A24-A28, A33 |
| 58 | A2, A7, A9, A11, A15-A17, A19-A22, A24, A26, A28, A33 |
| 59 | A1, A2, A7, A9, A11, A15-A17, A19-A22, A24, A26, A28, A33 |
| 60 | A1, A2, A7, A9, A11, A15-A17, A19-A22, A24, A26, A28 |
| 61-63 | A1, A2, A7, A9, A11, A15-A17, A19-A22, A24, A28 |
| 64-67 | A1, A2, A6, A7, A9, A11, A15-A17, A19-A22, A24 |
| 68 | A1-A3, A6, A7, A9, A11, A15-A17, A19-A22, A24 |
| 69-72 | A1-A3, A6-A9, A11, A15-A17, A19-A22, A24 |
| 73 | A1-A3, A5-A9, A11, A15-A17, A19-A22, A24 |
| 74-75 | A1, A2, A5-A9, A11, A15-A17, A19-A22, A24 |
| 76-79 | A1, A2, A5-A11, A15-A17, A19-A22, A24 |
| 80 | A1, A2, A5-A12, A15-A17, A19-A22, A24 |
| 81-82 | A1, A2, A5-A12, A15-A22, A24 |
| 83 | A1, A2, A5-A13, A15-A24 |
| 84 | A1-A3, A5-A13, A15-A24 |
| 85 | A1, A2, A5-A13, A15-A24 |
| 86-89 | A1, A2, A5-A24 |
| 90-96 | A1-A3, A5-A24 |
| 97-98 | A1-A24 |
| 99-100 | A1-A21, A23, A24 |
| 101-120 | A1, A2, A4-A21, A23, A24 |
| 121-128 | A1-A21, A23, A24 |
| 129-130 | A1-A3, A15, A16, A18, A20, A21 |
| 131-149 | A1-A4 |

FIG.16

| Index | G(x) | w | Index | G(x) | w |
|---|---|---|---|---|---|
| B1 | 156F3 | 11 | B9 | 17BBD | 13 |
| B2 | 12109 | 5 | B10 | 179CB | 11 |
| B3 | 1333F | 11 | B11 | 127C9 | 9 |
| B4 | 171E7 | 11 | B12 | 13399 | 9 |
| B5 | 17233 | 9 | B13 | 1DD77 | 13 |
| B6 | 127F9 | 11 | B14 | 17CFB | 13 |
| B7 | 13693 | 9 | B15 | 16FED | 13 |
| B8 | 11931 | 7 | | | |

FIG.17

| n | G(x) |
|---|---|
| 152-170 | B1-B15 |
| 171-255 | B1-B10, B14, B15 |

FIG.18

| Index | G(x) | w | Index | G(x) | w |
|---|---|---|---|---|---|
| C1 | 1941F | 9 | C19 | 1B567 | 11 |
| C2 | 16087 | 7 | C20 | 19C7B | 11 |
| C3 | 11A3D | 9 | C21 | 1D67F | 13 |
| C4 | 112F3 | 9 | C22 | 10B97 | 9 |
| C5 | 135A3 | 9 | C23 | 10595 | 7 |
| C6 | 1364B | 9 | C24 | 11513 | 7 |
| C7 | 104AD | 7 | C25 | 12E7D | 11 |
| C8 | 10E97 | 9 | C26 | 1D1AF | 11 |
| C9 | 16F17 | 11 | C27 | 12913 | 7 |
| C10 | 1311F | 9 | C28 | 14C0B | 7 |
| C11 | 1B2DB | 11 | C29 | 1CA9F | 11 |
| C12 | 154FD | 11 | C30 | 102D9 | 7 |
| C13 | 186BF | 11 | C31 | 127A3 | 9 |
| C14 | 1814B | 7 | C32 | 10FAF | 11 |
| C15 | 162FB | 11 | C33 | 158BF | 11 |
| C16 | 1F27F | 13 | C34 | 11709 | 7 |
| C17 | 1CCCF | 11 | C35 | 1352B | 9 |
| C18 | 143CB | 8 | C36 | 1A6DB | 11 |

FIG.19

| n | G(x) |
|---|---|
| 258-595 | C1-C36 |
| 596-600 | C1-C7, C9-C35 |
| 600-606 | C1-C7, C10-C35 |
| 607-617 | C1-C4, C6, C7, C10-C35 |
| 618-626 | C1-C4, C6, C7, C10, C12-C35 |
| 627-635 | C1-C4, C6, C7, C10, C12, C13, C15-C35 |
| 636-650 | C1-C4, C6, C7, C10, C13, C15-C35 |
| 651-667 | C1-C4, C7, C10, C13, C15-C35 |
| 668-679 | C1-C4, C10, C13, C15-C35 |
| 680-695 | C1, C3, C4, C10, C13, C15-C35 |
| 696-699 | C1, C4, C10, C13, C15-C35 |
| 700-704 | C1, C10, C13, C15-C35 |
| 705-727 | C1, C10, C13, C16-C35 |
| 728-730 | C1, C10, C13, C16, C18-C35 |
| 731-735 | C1, C10, C13, C16, C18-C20, C22-C35 |
| 736-739 | C1, C13, C16, C18-C20, C22-C35 |
| 740-747 | C1, C13, C16, C18, C20, C22-C35 |
| 748-749 | C1, C13, C16, C18, C22-C35 |
| 750-755 | C1, C13, C16, C18, C23-C35 |
| 756 | C13, C16, C18, C23-C35 |
| 757-817 | C13, C16, C18, C23, C24, C26-C35 |
| 818-819 | C13, C18, C23, C24, C26-C35 |
| 820-878 | C13, C23, C24, C26-C35 |
| 879-934 | C23, C24, C26-C35 |
| 935-1028 | C24, C26-C35 |
| 1029-8001 | C26-C35 |

FIG.20

| DATA TYPE | UNDETECTED ERROR PROBABILITY $P_{ud}$ (bit-error rate of $10^{-4}$) | | |
|---|---|---|---|
| | COMPARATIVE EXAMPLE CCITT | EMBODIMENT | |
| | | $G_1(x)=171E7$ | $G_2(x)=11A3D$ |
| HEADER, n=176 | $1.56 \times 10^{-13}$ | $1.99 \times 10^{-16}$ | — |
| SUB-HEADER, n=656 | $2.17 \times 10^{-11}$ | — | $1.05 \times 10^{-11}$ |

US 9,209,931 B2

DEVICE AND METHOD FOR TRANSMISSION, DEVICE AND METHOD FOR RECEPTION, AND PROGRAM

TECHNICAL FIELD

The present invention relates to a device and a method for transmission, a device and a method for reception, and a program, and particularly to a device and a method for transmission, a device and a method for reception, and a program that make it possible to obtain an undetected error probability characteristic close to a limit value in a system using a CRC for a plurality of pieces of data having different code lengths.

BACKGROUND ART

When data is transmitted from an information recording device to an information reproducing device or when data is transmitted from a transmitting device to a receiving device, an error may occur in the data on a transmission line or the like. There is a CRC (Cyclic Redundancy Check) as a method for detecting whether an error has occurred in the data. In order to perform a CRC, data to be transmitted needs to be CRC-coded in advance in a device on a transmitting side.

FIG. 1 is a block diagram showing an example of configuration of a transmitting and receiving system.

The transmitting and receiving system of FIG. 1 is formed by connecting a transmitting device 1 and a receiving device 3 to each other via a transmission line 2. The transmitting device 1 is composed of a CRC coder 11, an error correction coder 12, and a transmission line coder 13. The receiving device 3 is composed of a code detector 21, a transmission line decoder 22, an error correction decoder 23, and a CRC detector 24. Transmission data as an object of transmission is input as an information word as an object of a CRC coding process to the CRC coder 11 in the transmitting device 1.

The information word as an object of the CRC coding process is input to the CRC coder 11 in the form of a bit string assuming values 1 and 0. Thus, an information word as an object of the CRC coding process will hereinafter be referred to also as an information bit series as appropriate. In addition, a codeword (CRC code) represented as a bit string assuming values 1 and 0 which codeword is obtained by subjecting an information bit series to the CRC coding process will hereinafter be referred to as a code bit series.

The CRC coder 11 performs the CRC coding process by adding a CRC parity to the input information word. The CRC coder 11 outputs a CRC code obtained by performing the CRC coding process to the error correction coder 12.

The error correction coder 12 subjects the CRC code supplied from the CRC coder 11 to an error correction coding process such as a Reed-Solomon coding process or the like, and outputs data resulting from the error correction coding process to the transmission line coder 13.

The transmission line coder 13 subjects the data supplied from the error correction coder 12 to a coding process (modulating process and the like) according to the transmission line 2, and transmits resulting data to the receiving device 3 via the transmission line 2. A signal representing the data transmitted from the transmission line coder 13 is input to the code detector 21 in the receiving device 3 via the transmission line 2.

The code detector 21 detects the data on the basis of the input signal, and outputs the detected data to the transmission line decoder 22.

The transmission line decoder 22 subjects the data supplied from the code detector 21 to a decoding process (demodulating process and the like) according to the transmission line 2, and outputs resulting data to the error correction decoder 23.

The error correction decoder 23 subjects the data supplied from the transmission line decoder 22 to an error correcting process, and outputs data resulting from the error correcting process as received data. The received data output from the error correction decoder 23 is supplied to a device in a succeeding stage as a received bit series made of a bit string assuming values 1 and 0, and is supplied to the CRC detector 24.

The CRC detector 24 subjects the received bit series supplied from the error correction decoder 23 to a CRC process to determine whether error correction has been made correctly, that is, whether there is an error in the received bit series. The CRC detector 24 outputs a coincidence signal indicating a result of the determination to the device in the succeeding stage.

When the device present in the stage succeeding the receiving device 3 is a recording device, and the recording device is provided with a drive for making the received data recorded on a recording medium, the coincidence signal output from the CRC detector 24 is used in a controller of the drive to improve reliability, or for example to determine whether to make a data retransmission request to the transmitting device 1. As other uses of the CRC code, the CRC code is used as a part of a postprocessor in the code detector 21, and is used for header information and transmission packets in packet communication.

Principles of error detection by the CRC code will be described in the following.

When a parity of r bits is added to an information word of k bits to form a codeword having a code length of n (n=k+r) bits, a value $M(x) \cdot x^r$ obtained by multiplying a (k−1)th order information polynomial M(x) representing the information word as a polynomial by $x^r$ is expressed by Equation (1) below, where R(x) and Q(x) are respectively an (r−1)th order remainder polynomial and a quotient polynomial obtained when the value $M(x) \cdot x^r$ is divided by an rth order generator polynomial G(x). In addition, when the codeword obtained by the CRC coding process is set as an (n−1)th order code polynomial W(x), the code polynomial W(x) is expressed by Equation (2) below.

[Equation 1]
$$M(x) \cdot x^r = Q(x) \cdot G(x) + R(x) \qquad (1)$$

[Equation 2]
$$W(x) = M(x) \cdot x^r - R(x) \qquad (2)$$

From Equations (1) and (2), the code polynomial W(x) is expressed by Equation (3) below. This code polynomial W(x) is divisible by the generator polynomial G(x).

[Equation 3]
$$W(x) = Q(x) \cdot G(x) \qquad (3)$$

From the above, when the received data supplied from the error correction decoder 23 to the CRC detector 24 is set as a reception polynomial Y(x), the CRC detector 24 in the receiving device 3 receiving the codeword expressed by the code polynomial W(x) which codeword is transmitted from the transmitting device 1 in FIG. 1 checks whether the reception polynomial Y(x) is divisible by the generator polynomial G(x).

When a result of the check shows that the reception polynomial Y(x) is divisible by the generator polynomial G(x), the reception polynomial Y(x) coincides with the code polynomial W(x), and therefore the CRC detector 24 determines that no error has occurred. When the reception polynomial Y(x) is not divisible by the generator polynomial G(x), on the other hand, the reception polynomial Y(x) does not coincide with the code polynomial W(x), and therefore the CRC detector 24 determines that an error has occurred on the transmission line 2.

Because the CRC code is a cyclic code, the CRC code can be easily implemented in a device using a shift register and an exclusive OR operation circuit when the generator polynomial G(x) is determined. As the generator polynomial G(x), a CRC-CCITT ($G(x)=x^{16}+x^{12}+x^5+1$) and a CRC-ANSI ($G(x)=x^{16}+x^{15}+x^2+1$) as 16-bit CRCs are widely known.

Description will be made in the following of configurations of the CRC coder 11 in the transmitting device 1 and the CRC detector 24 in the receiving device 3 when the generator polynomial $G(x)=x^3+x+1$ (r=3).

FIG. 2 is a diagram showing an example of configuration of the CRC coder 11.

As shown in FIG. 2, the CRC coder 11 is composed of a CRC parity generator 31, a selector 32, a selector 33, and a bit number counter 34. The CRC coder 11 having such a configuration generates a code bit series expressed by a code polynomial W(x) from an information bit series expressed by an information polynomial M(x).

The CRC parity generator 31 generates a CRC parity of r bits to be added to the information bit series of k bits, and outputs the generated CRC parity to the selector 32. A configuration of the CRC parity generator 31 will be described later with reference to FIG. 3.

The selector 32 selects one of outputs $R00_{out}$, $R01_{out}$, and $R02_{out}$ input from the CRC parity generator 31 to input terminals 00, 01, and 10 according to a select signal S0 output from a control circuit not shown in the figure, and outputs the output to a "1" input terminal of the selector 33 in order.

While the information bit series of k bits is input to a "0" input terminal of the selector 33, the selector 33 selects the information bit series and outputs the information bit series as it is according to a select signal S1 output from the bit number counter 34. In addition, in timing of an end of input of the information bit series, the selector 33 selects and outputs the CRC parity as the output of the selector 32 which output is input to the "1" input terminal.

Thus, a code bit series of code length n=k+r, which code bit series is composed of the information bit series of k bits and the CRC parity of r bits generated on the basis of the information bit series of k bits, is output from the selector 33.

FIG. 3 is a circuit diagram showing an example of configuration of the CRC parity generator 31 in FIG. 2. As described above, the generator polynomial G(x) is $x^3+x+1$.

As shown in FIG. 3, the CRC parity generator 31 is formed by cyclically connecting a shift register R00, an EXOR1 as a first exclusive OR operation circuit, a shift register R01, a shift register R02, and an EXOR2 as a second exclusive OR operation circuit. An output of the EXOR2 is input to the shift register R00, and is input to the EXOR1.

The information bit series expressed by the information polynomial M(x) is input to the EXOR2 bit by bit in order from the bit of a high-order term at each time (in each timing defined by a clock signal for operating the shift registers, for example). An information bit series $M(x) \cdot x^r$ in the form of the information polynomial M(x) multiplied by $x^r$ in advance is input to the CRC parity generator 31. An initial value of the shift registers R00, R01, and R02 is zero.

When the input of the bit of a zeroth-order term of the information bit series to the CRC parity generator 31 is finished, an enable signal E0 output from the control circuit not shown in the figure is disabled (inactive state), and the values of the shift registers R00, R01, and R02 are retained. The values of the shift registers R00, R01, and R02 at a point in time when the input of the bit of the zeroth-order term of the information bit series to the CRC parity generator 31 is finished are coefficients of respective orders of a remainder polynomial R(x). That is, the remainder polynomial R(x) is expressed as R(x)=(Value of R02)$\times x^2$+(Value of R01)$\times x$+(Value of R00).

The values of the shift registers R00, R01, and R02 are output to the selector 32 as outputs $R00_{out}$, $R01_{out}$, and $R02_{out}$, respectively. The output $R00_{out}$ is input to the input terminal 00 of the selector 32. The output $R01_{out}$ is input to the input terminal 01 of the selector 32. The output $R02_{out}$ is input to the input terminal 00 of the selector 32.

FIG. 4 is a diagram showing an example of configuration of the CRC detector 24 in the receiving device 3.

As shown in FIG. 4, the CRC detector 24 is composed of a CRC parity checker 41 and a comparator 42. The CRC detector 24 having such a configuration checks whether there is an error in a received bit series expressed by a reception polynomial Y(x) which received bit series is supplied from the error correction decoder 23.

The CRC parity checker 41 divides the reception polynomial Y(x) by the generator polynomial G(x), and outputs $R10_{out}$, $R11_{out}$, and $R12_{out}$ representing the coefficients of the remainder polynomial R(x) to the comparator 42.

The comparator 42 determines whether a result of dividing the reception polynomial Y(x) by the generator polynomial G(x) has a remainder on the basis of the outputs $R10_{out}$, $R11_{out}$, and $R12_{out}$ from the CRC parity checker 41.

When the comparator 42 determines that the result of dividing the reception polynomial Y(x) by the generator polynomial G(x) does not have a remainder and that the reception polynomial Y(x) is divisible by the generator polynomial G(x) because the values of the outputs $R10_{out}$, $R11_{out}$, and $R12_{out}$ are all zero, the comparator 42 determines that no error has occurred in the data because the reception polynomial Y(x) coincides with the code polynomial W(x), and outputs a coincidence signal indicating that the reception polynomial Y(x) coincides with the code polynomial W(x). In addition, when the comparator 42 determines that the result of dividing the reception polynomial Y(x) by the generator polynomial G(x) has a remainder and that the reception polynomial Y(x) is not divisible by the generator polynomial G(x), the comparator 42 determines that an error has occurred in the data because the reception polynomial Y(x) does not coincide with the code polynomial W(x), and outputs a coincidence signal indicating that the reception polynomial Y(x) does not coincide with the code polynomial W(x).

FIG. 5 is a circuit diagram showing an example of configuration of the CRC parity checker 41 in FIG. 4.

The configuration of the CRC parity checker 41 corresponds to the configuration of the CRC parity generator 31 shown in FIG. 3. As shown in FIG. 5, the CRC parity checker 41 is formed by cyclically connecting an EXOR11 as a first exclusive OR operation circuit, a shift register R10, an EXOR12 as a second exclusive OR operation circuit, a shift register R11, and a shift register R12. The output of the shift register R12 is input as the output $R12_{out}$ to the comparator 42, and is input to the EXOR11 and the EXOR12.

The received bit series expressed by the reception polynomial Y(x) is input to the EXOR11 bit by bit in order from the bit of a high-order term at each time. An initial value of the shift registers R10, R11, and R12 is zero.

The values of the shift registers R10, R11, and R12 at a point in time when the input of the bit of the zeroth-order term of the received bit series to the CRC parity checker 41 is finished are coefficients of respective orders of a remainder polynomial R(x). That is, the remainder polynomial R(x) is expressed as R(x)=(Value of R12)×x²+(Value of R11)×x+(Value of R10).

The values of the shift registers R10, R11, and R12 are output to the comparator 42 as outputs $R10_{out}$, $R11_{out}$, and $R12_{out}$, respectively.

The performance of the CRC implemented by the devices having the configurations as described above is generally greatly affected by the order of the generator polynomial G(x), undetected error probability $P_{ud}$, and minimum Hamming distance $d_{min}$.

For example, a random error detecting capability can detect all of ($d_{min}$-1) errors or less. However, a large number of other errors can also be detected. In addition, a burst error detecting capability can detect all errors whose length is equal to or less than the order of the generator polynomial G(x). However, many of burst errors whose length is greater than the order of the generator polynomial can also be detected.

The undetected error probability $P_{ud}$ refers to a probability of a received bit series being changed to a different code bit series from a transmitted code bit series (code bit series obtained by adding a CRC parity to another information bit series than an information bit series given as data as an object of transmission) due to an error occurring on the transmission line, and the device on the receiving side determining that there is no error even when there is actually an error in the received bit series.

The undetected error probability $P_{ud}$ is expressed as in Equations (4) and (5) below by a parity number r, code length n, weight distribution A determined when the generator polynomial G(x) and the code length n are determined or the weight distribution B of dual code, and channel bit error probability (transition probability) ϵ on a binary symmetric channel (Non-Patent Document 1).

[Equation 4]
$$P_{ud} = \sum_{i=0}^{n} A_i \varepsilon^i (1-\varepsilon)^{n-i} \quad (4)$$

[Equation 5]
$$P_{ud} = 2^{-r} \sum_{i=0}^{n} B_i (1-2\varepsilon)^i - (1-\varepsilon)^n \quad (5)$$

Non-Patent Documents 2 to 8 propose various generator polynomials that minimize the undetected error probability according to the order of the generator polynomial (parity number) and the code length.

For example, Non-Patent Documents 2 and 3 propose a generator polynomial such as minimizes the undetected error probability of code at each code length in a 16-bit CRC.

In addition, Non-Patent Documents 5 and 8 show that there is a characteristic such that when the code length n is changed, the undetected error probability $P_{ud}$ changes to an extreme with a code length where the minimum Hamming distance $d_{min}$ changes as a boundary. This characteristic is shown in FIG. 6. FIG. 6 shows minimum (limit) undetected error probability in a 16-bit CRC.

An axis of abscissas of FIG. 6 indicates the code length n (bits), and an axis of ordinates indicates the undetected error probability $P_{ud}$. A dotted line in FIG. 6 represents undetected error probability when a G(x)=$x^{16}+x^{12}+x^5+1$ adopted by the CRC-CCITT standard is used for data of each code length, and a solid line represents theoretical limit undetected error probability in a 16-bit CRC.

Patent Document 1 discloses an invention relating to a method of selecting a CRC generator polynomial. In this invention, when an order of the generator polynomial is given, a generator polynomial is selected on the basis of a distance spectrum calculated for all generator polynomials of the order. The distance spectrum is a table showing the number of codewords at each Hamming distance. A generator polynomial having a maximum and minimum Hamming distance and minimizing the undetected error probability is thereby selected.

Patent Document 2 discloses a method of selecting a generator polynomial that has as low an undetected error probability as possible and as large a minimum Hamming distance as possible at a given code length and a given CRC parity length and which is usable in as wide a code length range as possible.

PRIOR ART DOCUMENTS

Patent Documents
Patent Document 1: U.S. Pat. No. 6,085,349
Patent Document 2: Japanese Patent Laid-Open No. 2006-180172

Non-Patent Documents
Non-Patent Document 1: J. K. Wolf, R. D. Blakeney, "An exact evaluation of the probability of undetected error for certain shortened binary CRC codes," Military Communications Conference, 1988. MILCOM 88, Conference record. '21st Century Military Communications—What's Possible?' 1988 IEEE, vol. 1, pp. 287-292, October 1988.
Non-Patent Document 2: T. Baicheva, S. Dodunekov, and P. Kazakov, "Undetected error probability performance of cyclic redundancy-check codes of 16-bit redundancy," IEE Proc. -Commun., vol. 147, no. 5, pp. 253-256, October 2000.
Non-Patent Document 3: P. Kazakov, "Fast calculation of the Number of Minimum-Weight Words of CRC Codes," IEEE. Trans. Inform. Theory, vol. 47, no. 3, pp. 1190-1195, March 2001.
Non-Patent Document 4: P. Koopman, "Cyclic Redundancy Code (CRC) Polynomial Selection For Embedded Networks," The International Conference on Dependable System and Networks, DSN-2004.
Non-Patent Document 5: G. Castagnoli, J. Ganz, P. Graber, "Optimum Cyclic Redundancy-Check Codes with 16-Bit Redundancy," IEEE Trans. Commun., vol. 38, no. 1, pp. 111-114, January 1990.
Non-Patent Document 6: G. Funk, "Determination of Best Shortened Codes," IEEE Trans. Commun., vol. 44, no. 1, pp. 1-6, January 1996.
Non-Patent Document 7: D. Chun, J. K. Wolf, "Special Hardware for Computing the Probability of Undetected Error for Certain CRC Codes and Test Results," IEEE Trans. Commun., vol. 42, no. 10, pp. 2769-2772, October 1994.
Non-Patent Document 8: G. Castagnoli, S. Brauer, M. Herrmann, "Optimum of Cyclic Redundancy-Check Codes with 24 and 32 Parity Bits," IEEE Trans. Commun., vol. 41, no. 6, pp. 883-892, June 1993.

SUMMARY OF INVENTION

Technical Problems

As described above, CRC performance (the undetected error probability and the number of bits from which an error can be detected reliably) is determined by the generator polynomial and the code length. There is no generator polynomial having an optimum undetected error probability and an optimum minimum Hamming distance at all code lengths. An optimum generator polynomial differs according to code length.

That is, the generator polynomials shown in the CRC-CCITT standard and the ANSI standard used widely and Non-Patent Documents 4 to 8 have an optimum undetected error probability and an optimum minimum Hamming distance in a limited range of code length.

In addition, as shown in FIG. 6, the generator polynomial adopted by the CRC-CCITT standard or the like is designed to minimize the undetected error probability when data having a long code length of a few thousand bits is set as an object. There is a generator polynomial exhibiting even better performance when short data having a code length of less than a few thousand bits is set as an object.

Further, various code lengths and CRC parity lengths are used in an actual system. However, an optimum generator polynomial for all code lengths and CRC parity lengths has not been known so far. Currently known generator polynomials alone are not necessarily sufficient in obtaining a minimum undetected error probability in an actual system.

A common system of communication performed with information formed by adding header data and sub-header data to user data as a unit frequently uses a CRC for both header data and sub-header data or frequently uses a CRC for both header data and user data.

Even in such a case, however, a single generator polynomial is generally used, and a communication system that has actually been put to practical use does not change the generator polynomial according to change in code length of object data. Although Patent Document 2 discloses a method of selecting a generator polynomial according to code length, it cannot necessarily be said that sufficient consideration has been given to thus selecting a generator polynomial so as to correspond to change in code length of object data.

When a generator polynomial adopted by the CRC-CCITT standard or the like which generator polynomial is designed to minimize the undetected error probability when code length is long is used singly for a plurality of pieces of data that greatly differ in code length, only undetected error probability performance greatly degraded from limit values is obtained when data of short code length is set as an object, of course.

For example, header data and sub-header data defined by an IEEE802.15.3c standard have a code length of a few hundred bits. When processing is to be performed using the same generator polynomial as that adopted by the CRC-CCITT standard for such data having a code length of a few hundred bits, the undetected error probability is rather remote from theoretical limit values as shown in FIG. 6 as characteristics when code length is in the vicinity of a few hundred bits.

The present invention has been made in view of such a situation, and is particularly to enable processing to be performed using a generator polynomial providing undetected error probability close to limit values even when the code length of object data is relatively short.

Technical Solution

A transmitting device according to an aspect of the present invention includes: CRC coding process means for, having a plurality of generator polynomials for a CRC coding process performed on each of a plurality of pieces of data having different code lengths, selecting a generator polynomial according to object data, and performing the CRC coding process; and transmitting means for transmitting data resulting from the CRC coding process performed by the CRC coding process means.

A first generator polynomial for first data having a first code length and a second generator polynomial for second data having a second code length are set as the plurality of generator polynomials in the CRC coding process means, and the CRC coding process means can select one of the first generator polynomial and the second generator polynomial according to whether the object data is the first data or the second data, and perform the CRC coding process.

The first generator polynomial can be a generator polynomial whose minimum Hamming distance is equal to a maximum value of minimum Hamming distance at the first code length and be a generator polynomial selected from a predetermined number of generator polynomials selected in increasing order of undetected error probability, and the second generator polynomial can be a generator polynomial whose minimum Hamming distance is equal to a maximum value of minimum Hamming distance at the second code length and be a generator polynomial selected from a predetermined number of generator polynomials selected in increasing order of undetected error probability.

A transmitting method or a program according to an aspect of the present invention includes the steps of: selecting a generator polynomial according to object data and performing a CRC coding process; and transmitting data resulting from the CRC coding process.

A receiving device according to another aspect of the present invention includes: obtaining means for obtaining data on a basis of a signal transmitted from a transmitting device; and CRC process means for, having a plurality of generator polynomials for a CRC process performed on each of a plurality of pieces of data having different code lengths, detecting a data error by selecting a generator polynomial according to the data obtained by the obtaining means and performing the CRC process.

A first generator polynomial for first data having a first code length and a second generator polynomial for second data having a second code length are set as the plurality of generator polynomials in the CRC process means, and the CRC process means can select one of the first generator polynomial and the second generator polynomial according to whether the data obtained by the obtaining means is the first data or the second data, and perform the CRC process.

The first generator polynomial can be a generator polynomial whose minimum Hamming distance is equal to a maximum value of minimum Hamming distance at the first code length and be a generator polynomial selected from a predetermined number of generator polynomials selected in increasing order of undetected error probability, and the second generator polynomial can be a generator polynomial whose minimum Hamming distance is equal to a maximum value of minimum Hamming distance at the second code length and be a generator polynomial selected from a predetermined number of generator polynomials selected in increasing order of undetected error probability.

A receiving method or a program according to another aspect of the present invention includes the steps of: obtaining data on a basis of a signal transmitted from a transmitting device; and detecting a data error by selecting a generator polynomial according to the obtained data and performing a CRC process.

In one aspect of the present invention, a generator polynomial is selected according to object data, a CRC coding process is performed, and data obtained by performing the CRC coding process is transmitted.

In another aspect of the present invention, data is obtained according to a signal transmitted from a transmitting device, and a data error is detected by selecting a generator polynomial according to the obtained data and performing a CRC process.

Advantageous Effect

According to the present invention, processing can be performed using a generator polynomial providing undetected error probability close to limit values.

BRIEF DESCRIPTION OF DRAWINGS

FIG. 14 is a diagram showing generator polynomial candidates.

FIG. 15 is a diagram showing the generator polynomial candidates in FIG. 14 divided by code length.

FIG. 16 is another diagram showing generator polynomial candidates.

FIG. 17 is a diagram showing the generator polynomial candidates in FIG. 16 divided by code length.

FIG. 18 is yet another diagram showing generator polynomial candidates.

FIG. 19 is a diagram showing the generator polynomial candidates in FIG. 18 divided by code length.

FIG. 20 is a diagram showing results of calculation of undetected error probability.

MODE FOR CARRYING OUT THE INVENTION

Figure 7:
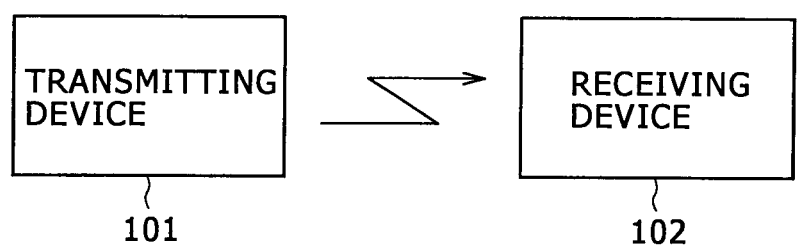
FIG. 7 is a block diagram showing an example of configuration of a transmitting and receiving system according to an embodiment of the present invention.

FIG. 7 is a block diagram showing an example of configuration of a transmitting and receiving system according to an embodiment of the present invention.

The transmitting and receiving system of FIG. 7 is composed of a transmitting device 101 as a device on a data transmitting side and a receiving device 102 as a device on a data receiving side. In the transmitting and receiving system of FIG. 7, data is transmitted and received according to an IEEE802.15.3c standard, which is a radio communication standard using millimeter waves in a 60-GHz band, for example.

The transmitting device 101 subjects user data, which is data as a transmission object such as video data, audio data, and the like, header data, and sub-header data to a CRC coding process, an error correction coding process, and a transmission line coding process as appropriate, and transmits data resulting from these processes.

A generator polynomial for header data which generator polynomial is used when the CRC coding process is performed on header data and a generator polynomial for sub-header data which generator polynomial is used when the CRC coding process is performed on sub-header data are set in the transmitting device 101. The generator polynomials are selected according to data on which to perform the CRC coding process.

The generator polynomial for header data is a generator polynomial whose undetected error probability becomes lower when used for data of for example 176 bits equal to the code length of header data. The generator polynomial for sub-header data is a generator polynomial whose undetected error probability becomes lower when used for data of for example 656 bits equal to the code length of sub-header data. A method of selecting each generator polynomial will be described later.

The data transmitted from the transmitting device 101 is received by the receiving device 102 with a space as a transmission line.

The receiving device 102 detects the data from a received signal, and obtains received data by subjecting the detected data to a transmission line decoding process and an error correction decoding process. The obtained received data is used for reproduction, recording and the like of the received data by the receiving device 102 or an external device connected to the receiving device 102.

In addition, the receiving device 102 detects a data error by performing a CRC process on the received data. As in the transmitting device 101, the generator polynomial for header data and the generator polynomial for sub-header data are set in the receiving device 102. The generator polynomials to be used in the CRC process are selected.

A highly reliable CRC can be realized by thus selecting a generator polynomial according to whether object data is header data or sub-header data, performing the CRC coding process in the transmitting device 101, and performing the CRC process in the receiving device 102.

Figure 8:
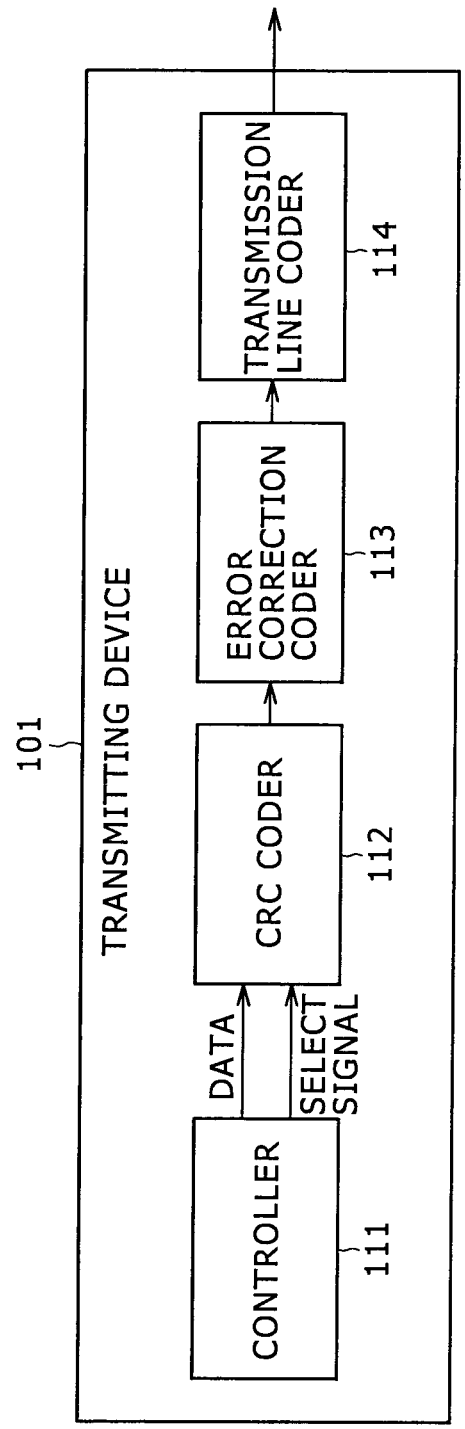
FIG. 8 is a block diagram showing an example of configuration of a transmitting device in FIG. 7.

FIG. 8 is a block diagram showing an example of configuration of the transmitting device 101.

As shown in FIG. 8, the transmitting device 101 is composed of a controller 111, a CRC coder 112, an error correction coder 113, and a transmission line coder 114.

The controller 111 outputs user data input by a user, header data, and sub-header data to the CRC coder 112 in predetermined order.

In addition, when data set as an object of the CRC coding process in the CRC coder 112 is header data, the controller 111 outputs a select signal for giving an instruction to perform the CRC coding process using the generator polynomial for header data. When data set as an object of the CRC coding process in the CRC coder 112 is sub-header data, on the other hand, the controller 111 outputs a select signal for giving an instruction to perform the CRC coding process using the generator polynomial for sub-header data. The controller 111 thus outputs a select signal specifying a generator polynomial to be used in the CRC coding process to the CRC coder 112 according to data set as an object of the CRC coding process.

The CRC coder 112 adds a CRC parity obtained by performing the CRC coding process on header data supplied from the controller 111 to a header, and adds a CRC parity obtained by performing the CRC coding process on sub-header data to a sub-header.

The CRC coding process performed on header data and the CRC coding process performed on sub-header data use respective different generator polynomials according to the select signal supplied from the controller 111. The CRC coder 112 outputs data in a predetermined format to which the header and the sub-header are added to the error correction coder 113. Incidentally, when the CRC coding process needs to be performed on the user data, a predetermined generator polynomial set in advance is used in the CRC coding process.

The error correction coder 113 subjects the data supplied from the CRC coder 112 to an error correction coding process such as a Reed-Solomon coding process or the like, and outputs data resulting from the error correction coding process to the transmission line coder 114.

The transmission line coder 114 subjects the data supplied from the error correction coder 113 to a coding process (a modulating process and the like) according to the transmission line, and transmits resulting data.

Figure 1:
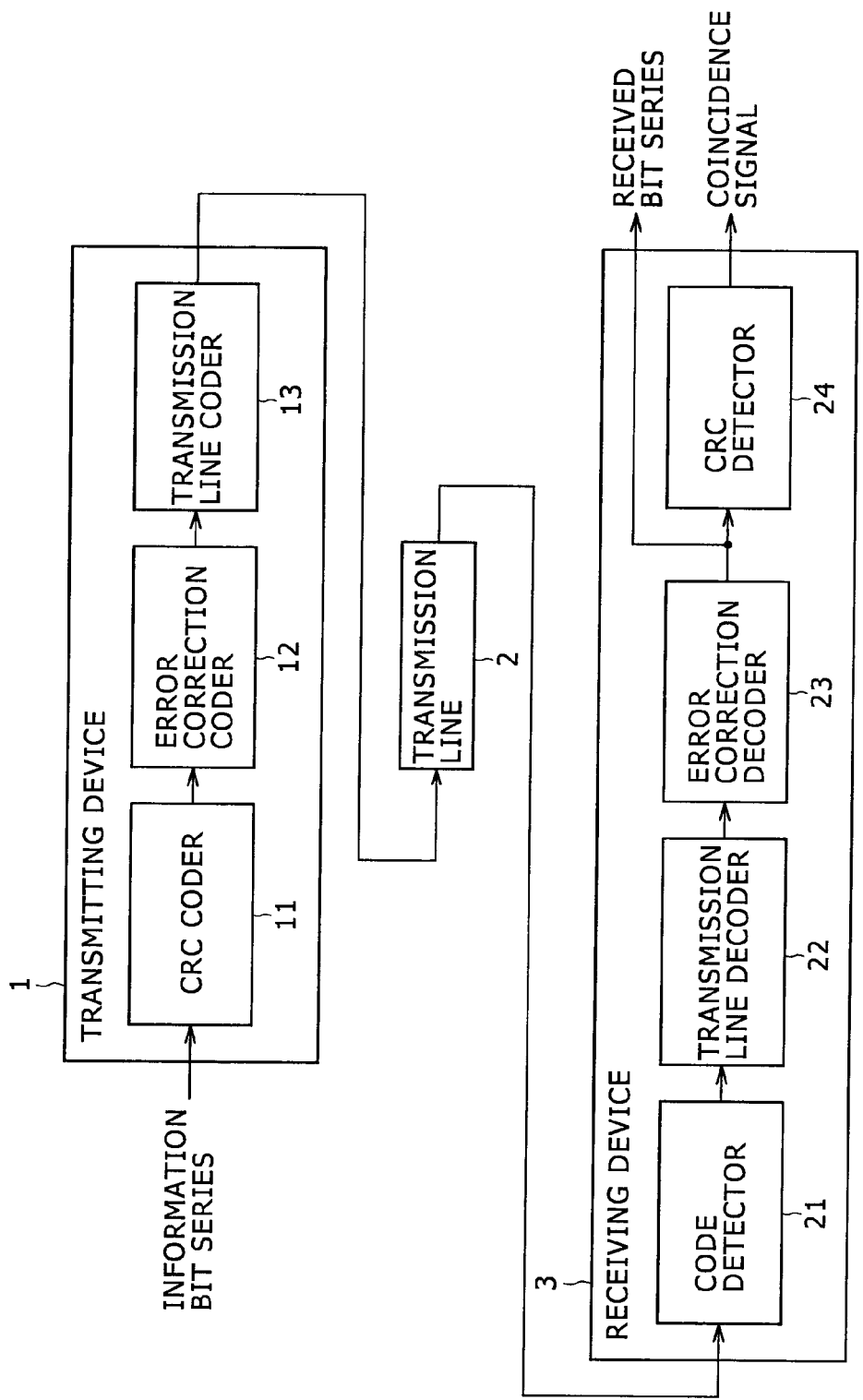
FIG. 1 is a block diagram showing an example of configuration of a transmitting and receiving system.
Figure 2:
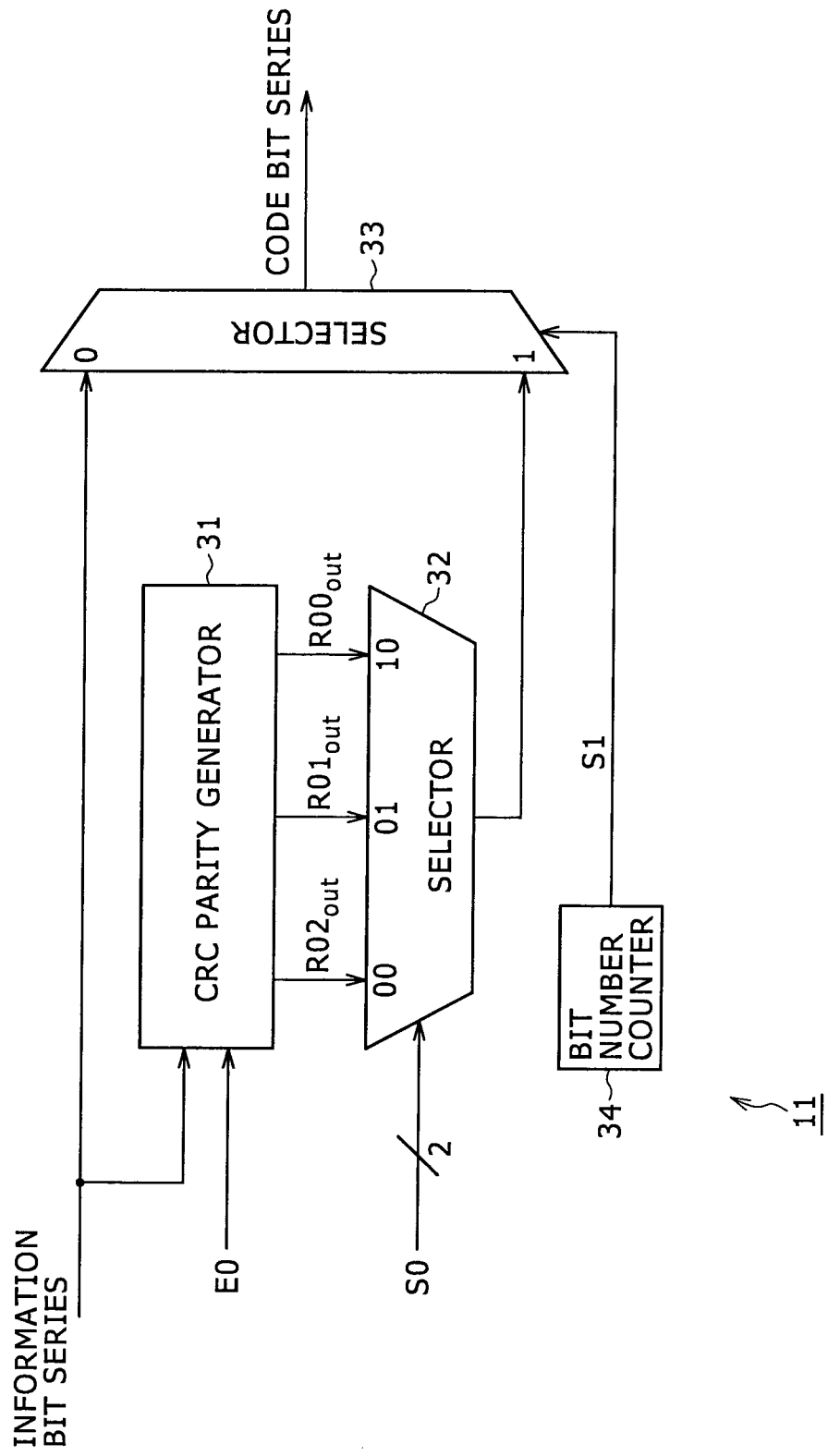
FIG. 2 is a diagram showing an example of configuration of a CRC coder in FIG. 1.
Figure 3:
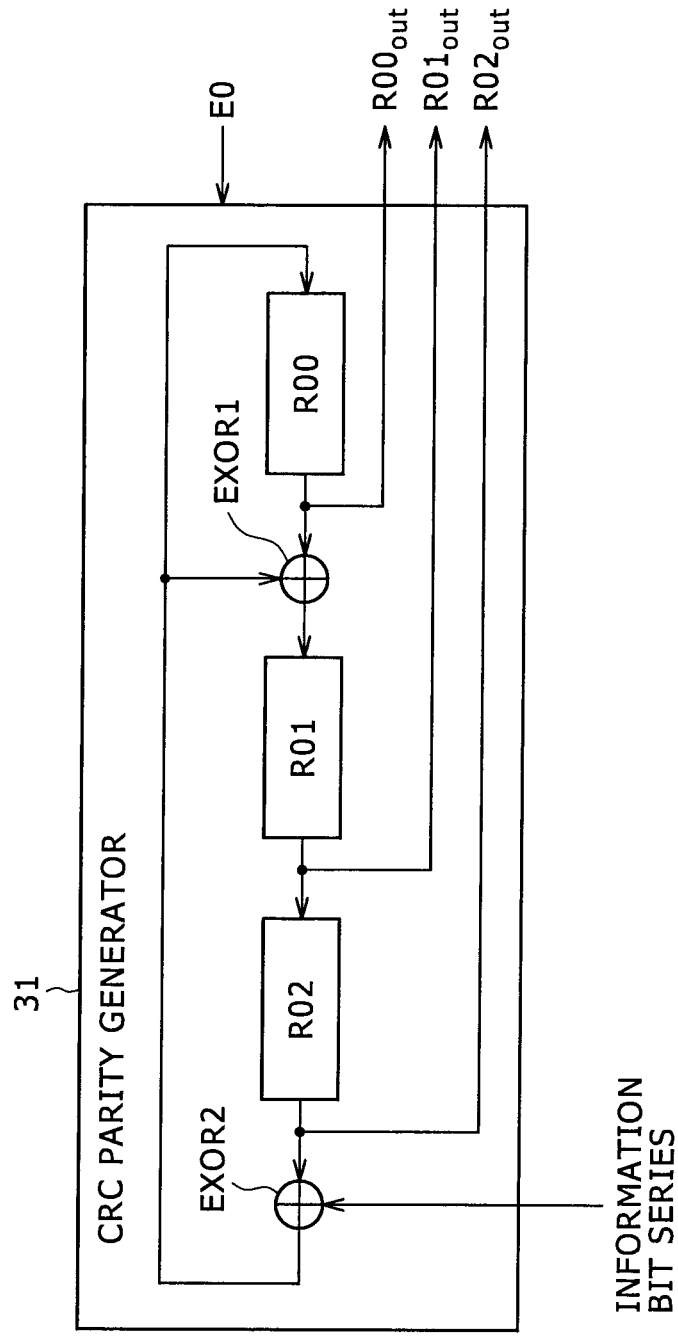
FIG. 3 is a circuit diagram showing an example of configuration of a CRC parity generator in FIG. 2.
Figure 4:
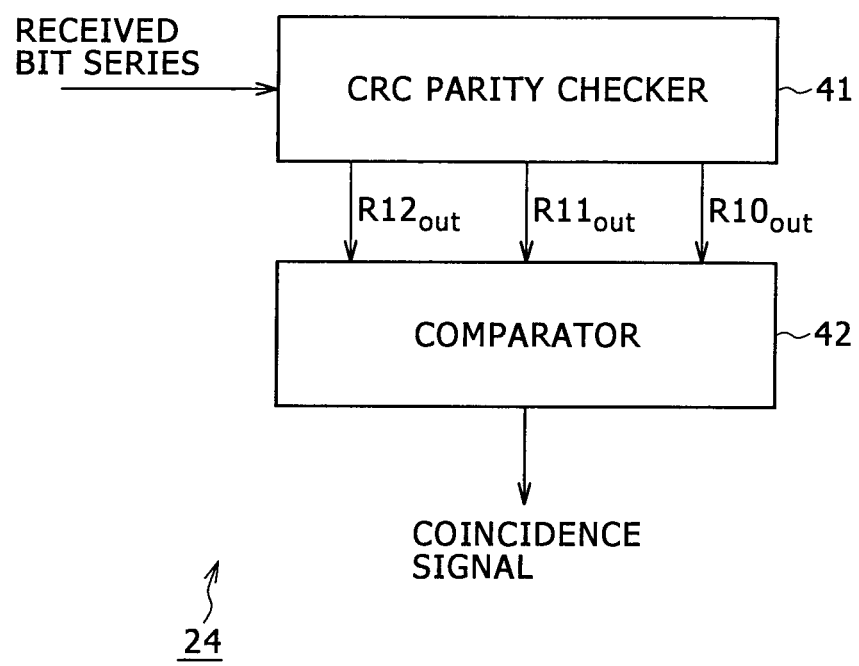
FIG. 4 is a diagram showing an example of configuration of a CRC detector in FIG. 1.
Figure 9:
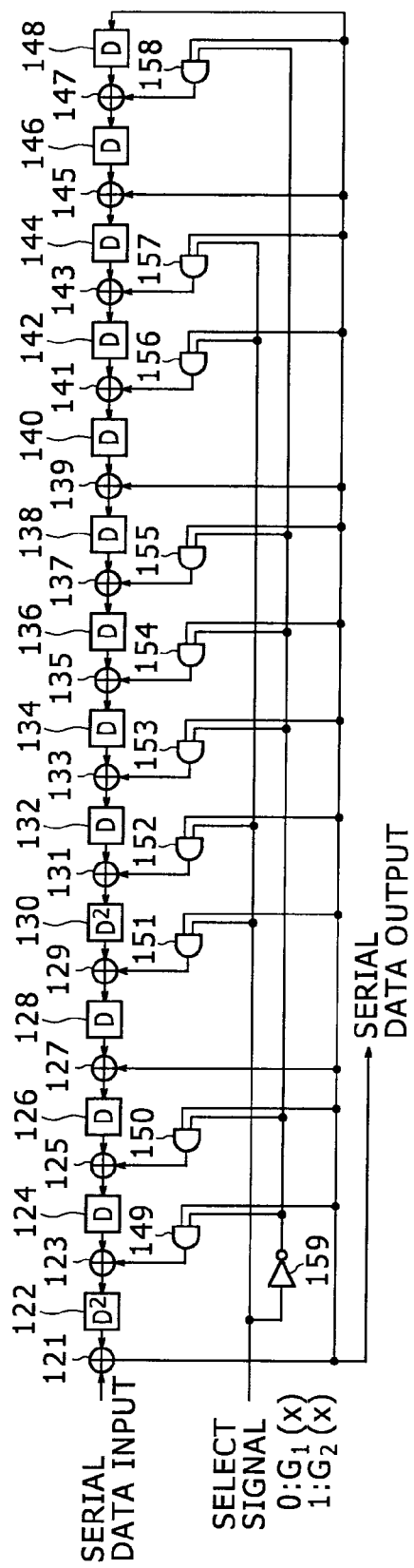
FIG. 9 is a circuit diagram showing an example of configuration of a part for generating CRC parity in a CRC coder in FIG. 8.

FIG. 9 is a diagram showing an example of configuration of a part for generating a CRC parity (part corresponding to the CRC parity generator 31 in FIG. 3) in the CRC coder 112 in FIG. 8.

Serial data (information bit series) forming header data or sub-header data is input to the circuit of FIG. 9.

FIG. 9 shows an example in which $G_1(x)=x^{16}+x^{14}+x^{13}+x^{12}+x^8+x^7+x^6+x^5+x^2+x+1$ is used as a generator polynomial for header data and $G_2(x)=x^{16}+x^{12}+x^{11}+x^9+x^5+x^4+x^3+x^2+1$ is used as a generator polynomial for sub-header data. When the select signal from the controller 111 indicates a value 0, an operation is performed using the generator polynomial $G_1(x)=x^{16}+x^{14}+x^{13}+x^{12}+x^8+x^7+x^6+x^5+x^2+1$. When the select signal from the controller 111 indicates a value 1, an operation is performed using the generator polynomial $G_2(x)=x^{16}+x^{12}+x^{11}+x^9+x^5+x^4+x^3+x^2+1$. A superscript number to the right of a letter "D" within a block representing a shift register in FIG. 9 denotes the number of shift registers connected in series with each other. The same is true for FIG. 11 to be described later.

An EXOR circuit 121 performs an exclusive OR operation on the basis of the serial data input from the controller 111 and a value delayed by two timings in a shift register 122. A result of the operation of the EXOR circuit 121 is output as serial data, and is supplied to AND circuits 149 to 158, EXOR circuits 127, 139, and 145, and a shift register 148.

An EXOR circuit 147 performs an exclusive OR operation on the basis of the value delayed by one timing in the shift register 148 and a value supplied from the AND circuit 158. A result of the operation of the EXOR circuit 147 is supplied to a shift register 146.

An EXOR circuit 145 performs an exclusive OR operation on the basis of the value delayed by one timing in the shift register 146 and the value supplied from the EXOR circuit 121. A result of the operation of the EXOR circuit 145 is supplied to a shift register 144.

An EXOR circuit 143 performs an exclusive OR operation on the basis of the value delayed by one timing in the shift register 144 and a value supplied from the AND circuit 157. A result of the operation of the EXOR circuit 143 is supplied to a shift register 142.

An EXOR circuit 141 performs an exclusive OR operation on the basis of the value delayed by one timing in the shift register 142 and a value supplied from the AND circuit 156. A result of the operation of the EXOR circuit 141 is supplied to a shift register 140.

An EXOR circuit 139 performs an exclusive OR operation on the basis of the value delayed by one timing in the shift register 140 and the value supplied from the EXOR circuit 121. A result of the operation of the EXOR circuit 139 is supplied to a shift register 138.

An EXOR circuit 137 performs an exclusive OR operation on the basis of the value delayed by one timing in the shift register 138 and a value supplied from the AND circuit 155. A result of the operation of the EXOR circuit 137 is supplied to a shift register 136.

An EXOR circuit 135 performs an exclusive OR operation on the basis of the value delayed by one timing in the shift register 136 and a value supplied from the AND circuit 154. A result of the operation of the EXOR circuit 135 is supplied to a shift register 134.

An EXOR circuit 133 performs an exclusive OR operation on the basis of the value delayed by one timing in the shift register 134 and a value supplied from the AND circuit 153. A result of the operation of the EXOR circuit 133 is supplied to a shift register 132.

An EXOR circuit 131 performs an exclusive OR operation on the basis of the value delayed by one timing in the shift register 132 and a value supplied from the AND circuit 152. A result of the operation of the EXOR circuit 131 is supplied to a shift register 130.

An EXOR circuit 129 performs an exclusive OR operation on the basis of the value further delayed by two timings in the shift register 130 and a value supplied from the AND circuit 151. A result of the operation of the EXOR circuit 129 is supplied to a shift register 128.

An EXOR circuit 127 performs an exclusive OR operation on the basis of the value delayed by one timing in the shift register 128 and the value supplied from the EXOR circuit 121. A result of the operation of the EXOR circuit 127 is supplied to a shift register 126.

An EXOR circuit 125 performs an exclusive OR operation on the basis of the value delayed by one timing in the shift register 126 and a value supplied from the AND circuit 150. A result of the operation of the EXOR circuit 125 is supplied to a shift register 124.

An EXOR circuit 123 performs an exclusive OR operation on the basis of the value delayed by one timing in the shift register 124 and a value supplied from the AND circuit 149. A result of the operation of the EXOR circuit 123 is supplied to a shift register 122.

The AND circuits 149, 150, 153, 154, 155, and 158 output a value 1 when the value output from the EXOR circuit 121 and a value output as a select signal from the controller 111 and inverted in a NOT circuit 159 are both 1. Otherwise the AND circuits 149, 150, 153, 154, 155, and 158 output a value 0.

The AND circuits 151, 152, 156, and 157 output a value 1 when the value output from the EXOR circuit 121 and the value output as the select signal from the controller 111 are both 1. Otherwise the AND circuits 151, 152, 156, and 157 output a value 0.

Figure 10:
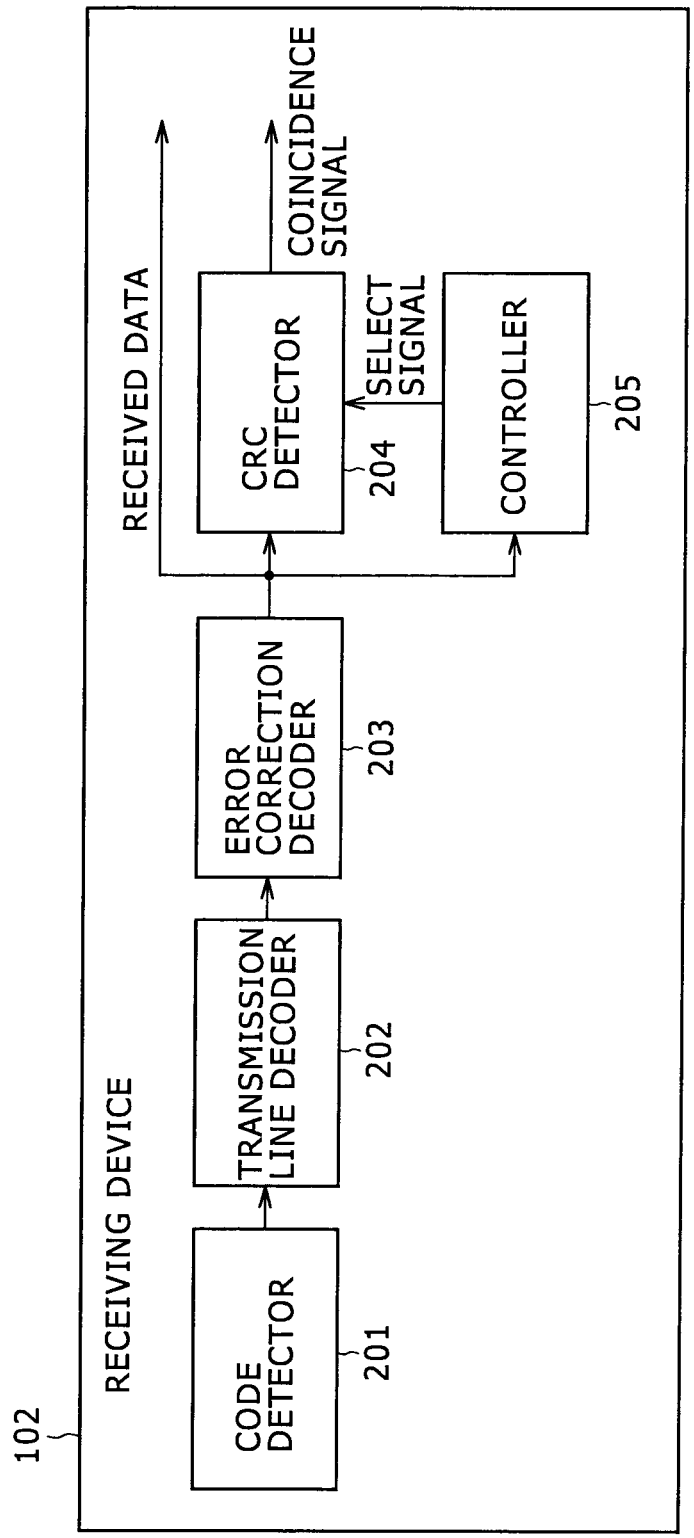
FIG. 10 is a block diagram showing an example of configuration of a receiving device in FIG. 7.

FIG. 10 is a block diagram showing an example of configuration of the receiving device 102.

As shown in FIG. 10, the receiving device 102 is composed of a code detector 201, a transmission line decoder 202, an error correction decoder 203, a CRC detector 204, and a controller 205.

The code detector 201 detects data on the basis of a received signal, and outputs the detected data to the transmission line decoder 202.

The transmission line decoder 202 subjects the data supplied from the code detector 201 to a decoding process (a demodulating process and the like) according to the transmission line, and outputs resulting data to the error correction decoder 203.

The error correction decoder 203 subjects the data supplied from the transmission line decoder 202 to an error correcting process, and outputs data resulting from the error correcting process as received data. The received data includes user data, header data, and sub-header data. The received data output from the error correction decoder 203 is supplied to a processing section in a succeeding stage that performs reproduction, recording and the like of the received data, and is supplied to the CRC detector 204 and the controller 205.

The CRC detector 204 subjects the received data supplied from the error correction decoder 203 to a CRC process, and detects a data error. When the CRC process is performed on the header data, the CRC detector 204 performs the process using the generator polynomial selected according to a select signal supplied from the controller 205. When the CRC process is performed on the sub-header data, the CRC detector 204 performs the process using the generator polynomial selected according to the select signal supplied from the controller 205.

The CRC detector 204 outputs a coincidence signal indicating a result of the detection to the processing section in the succeeding stage. The coincidence signal is used to determine whether to request the transmitting device 101 to retransmit the data, for example.

The controller 205 identifies the data set as an object of the CRC process in the CRC detector 204 on the basis of the received data supplied from the error correction decoder 203. The same received data as supplied to the CRC detector 204 is supplied from the error correction decoder 203 to the controller 205.

When data set as an object of the CRC process in the CRC detector 204 is header data, the controller 205 outputs a select signal for giving an instruction to perform the CRC process using the generator polynomial for header data. When data set as an object of the CRC process in the CRC detector 204 is sub-header data, on the other hand, the controller 205 outputs a select signal for giving an instruction to perform the CRC process using the generator polynomial for sub-header data. The controller 205 thus outputs a select signal specifying a generator polynomial to be used in the CRC process to the CRC detector 204 according to data set as an object of the CRC process.

Figure 5:
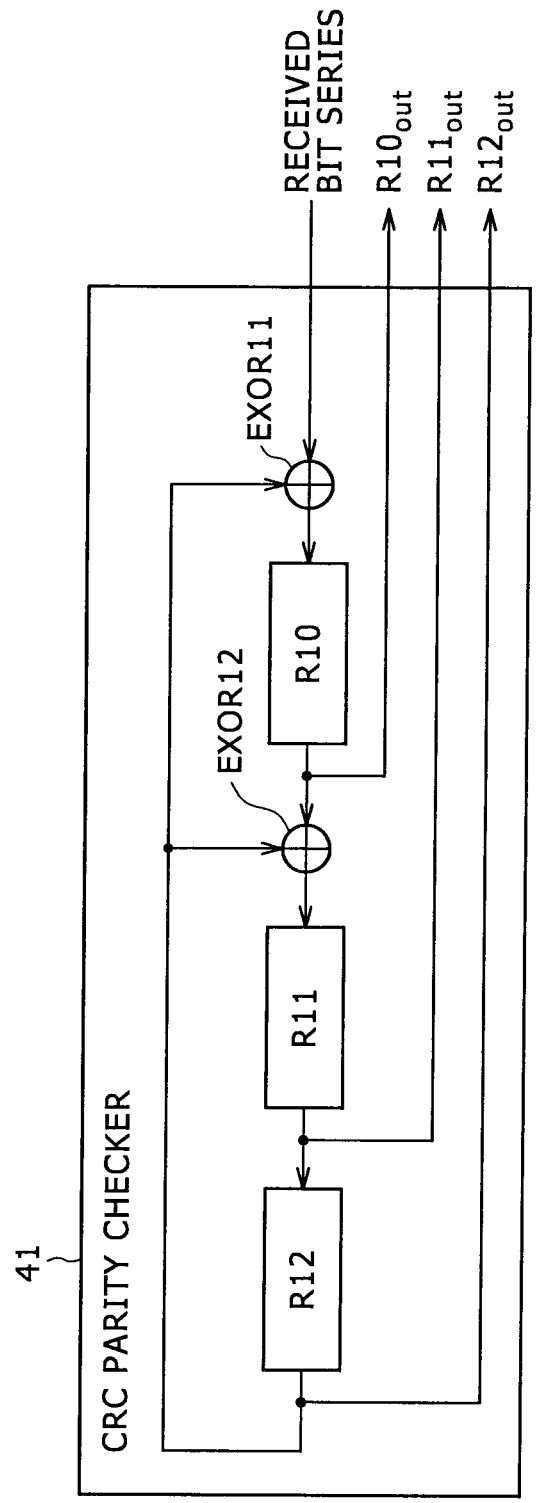
FIG. 5 is a circuit diagram showing an example of configuration of a CRC parity checker in FIG. 4.
Figure 11:
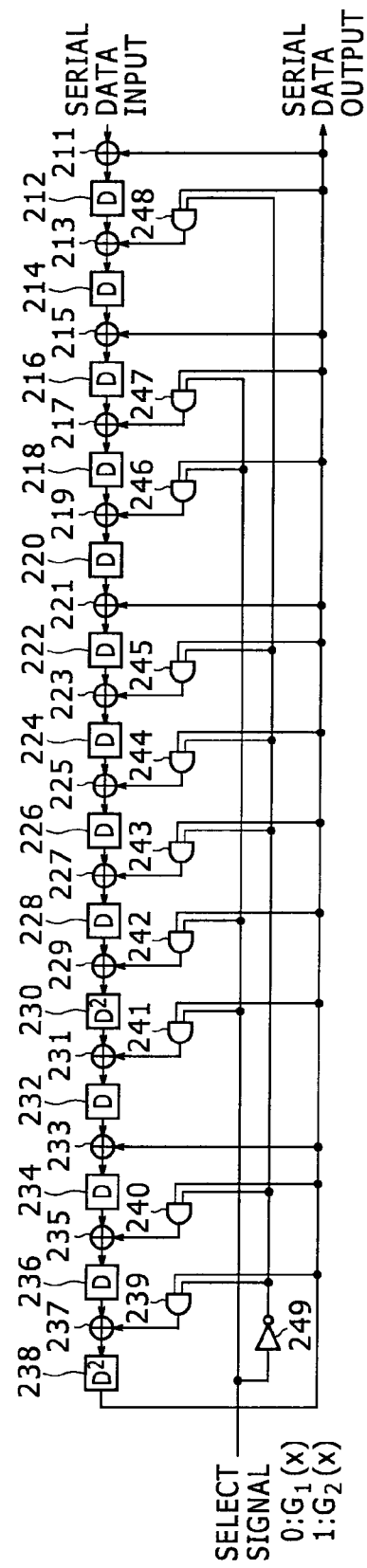
FIG. 11 is a circuit diagram showing an example of configuration of a part performing a CRC parity check in a CRC detector in FIG. 10.

FIG. 11 is a diagram showing an example of configuration of a part performing a CRC parity check (part corresponding to the CRC parity checker 41 of FIG. 5) in the CRC detector 204 in FIG. 10.

FIG. 11 also shows an example in which $G_1(x)=x^{16}+x^{14}+x^{13}+x^{12}+x^8+x^7+x^6+x^5+x^2+x+1$ is used as a generator polynomial for header data and $G_2(x)=x^{16}+x^{12}+x^{11}+x^9+x^5+x^4+x^3+x^2+1$ is used as a generator polynomial for sub-header data. When the select signal from the controller 205 indicates a value 0, an operation is performed using the generator polynomial $G_1(x)=x^{16}+x^{14}+x^{13}+x^{12}+x^8+x^7+x^6+x^5+x^2+1$. When the select signal from the controller 205 indicates a value 1, an operation is performed using the generator polynomial $G_2(x)=x^{16}+x^{12}+x^{11}+x^9+x^5+x^4+x^3+x^2+1$.

An EXOR circuit 211 performs an exclusive OR operation on the basis of the received data supplied as serial data from the error correction decoder 203 and a value delayed by two timings in a shift register 238. A result of the operation of the EXOR circuit 211 is supplied to a shift register 212.

An EXOR circuit 213 performs an exclusive OR operation on the basis of the value delayed by one timing in the shift register 212 and a value supplied from an AND circuit 248. A result of the operation of the EXOR circuit 213 is supplied to a shift register 214.

An EXOR circuit 215 performs an exclusive OR operation on the basis of the value delayed by one timing in the shift register 214 and the value supplied from the shift register 238. A result of the operation of the EXOR circuit 215 is supplied to a shift register 216.

An EXOR circuit 217 performs an exclusive OR operation on the basis of the value delayed by one timing in the shift register 216 and a value supplied from an AND circuit 247. A result of the operation of the EXOR circuit 217 is supplied to a shift register 218.

An EXOR circuit 219 performs an exclusive OR operation on the basis of the value delayed by one timing in the shift register 218 and a value supplied from an AND circuit 246. A result of the operation of the EXOR circuit 219 is supplied to a shift register 220.

An EXOR circuit 221 performs an exclusive OR operation on the basis of the value delayed by one timing in the shift register 220 and the value supplied from the shift register 238. A result of the operation of the EXOR circuit 221 is supplied to a shift register 222.

An EXOR circuit 223 performs an exclusive OR operation on the basis of the value delayed by one timing in the shift register 222 and a value supplied from an AND circuit 245. A result of the operation of the EXOR circuit 223 is supplied to a shift register 224.

An EXOR circuit 225 performs an exclusive OR operation on the basis of the value delayed by one timing in the shift register 224 and a value supplied from an AND circuit 244. A result of the operation of the EXOR circuit 225 is supplied to a shift register 226.

An EXOR circuit 227 performs an exclusive OR operation on the basis of the value delayed by one timing in the shift register 226 and a value supplied from an AND circuit 243. A result of the operation of the EXOR circuit 227 is supplied to a shift register 228.

An EXOR circuit 229 performs an exclusive OR operation on the basis of the value delayed by one timing in the shift register 228 and a value supplied from an AND circuit 242. A result of the operation of the EXOR circuit 229 is supplied to a shift register 230.

An EXOR circuit 231 performs an exclusive OR operation on the basis of the value delayed by two timings in the shift register 230 and a value supplied from an AND circuit 241. A result of the operation of the EXOR circuit 231 is supplied to a shift register 232.

An EXOR circuit 233 performs an exclusive OR operation on the basis of the value delayed by one timing in the shift register 232 and the value supplied from the shift register 238. A result of the operation of the EXOR circuit 233 is supplied to a shift register 234.

An EXOR circuit 235 performs an exclusive OR operation on the basis of the value delayed by one timing in the shift register 234 and a value supplied from an AND circuit 240. A result of the operation of the EXOR circuit 235 is supplied to a shift register 236.

An EXOR circuit 237 performs an exclusive OR operation on the basis of the value delayed by one timing in the shift register 236 and a value supplied from an AND circuit 239. A result of the operation of the EXOR circuit 237 is supplied to the shift register 238.

The AND circuits 239, 240, 243, 244, 245, and 248 output a value 1 when the value delayed by two timings in the shift register 238 and a value output as select signal from the controller 205 and inverted in a NOT circuit 249 are both 1. Otherwise the AND circuits 239, 240, 243, 244, 245, and 248 output a value 0.

The AND circuits 241, 242, 246, and 247 output a value 1 when the value delayed by two timings in the shift register 238 and the value output as the select signal from the controller 205 are both 1. Otherwise the AND circuits 241, 242, 246, and 247 output a value 0.

Processes of the transmitting device 101 and the receiving device 102 having the configurations as described above will be described in the following.

Figure 12:
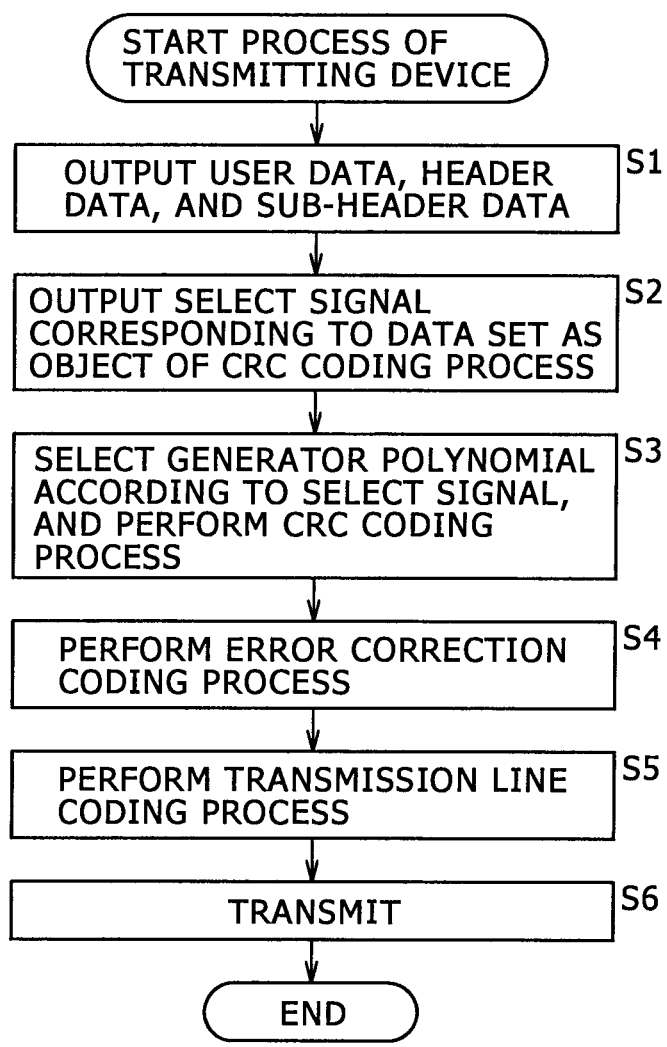
FIG. 12 is a flowchart of assistance in explaining a process of the transmitting device.

A process of the transmitting device 101 that transmits data will first be described with reference to a flowchart of FIG. 12. This process is started when a user of the transmitting device 101 inputs user data, header data, and sub-header data.

In step S1, the controller 111 outputs the user data, the header data, and the sub-header data input by the user to the CRC coder 112 in predetermined order.

In step S2, the controller 111 outputs a select signal specifying a generator polynomial to be used in a CRC coding process to the CRC coder 112 according to data set as an object of the CRC coding process.

In step S3, the CRC coder 112 selects the generator polynomial according to the select signal supplied from the controller 111, and performs the CRC coding process on the header data or the sub-header data. A CRC parity obtained by the CRC coding process using the generator polynomial for header data is added to a header. A CRC parity obtained by the CRC coding process using the generator polynomial for sub-header data is added to a sub-header.

In step S4, the error correction coder 113 performs an error correction coding process on data supplied from the CRC coder 112, and outputs data obtained by performing the error correction coding process to the transmission line coder 114.

In step S5, the transmission line coder 114 subjects the data supplied from the error correction coder 113 to a coding process according to the transmission line.

In step S6, the transmission line coder 114 transmits data obtained by performing the coding process to the receiving device 102, and the process is ended.

Figure 13:
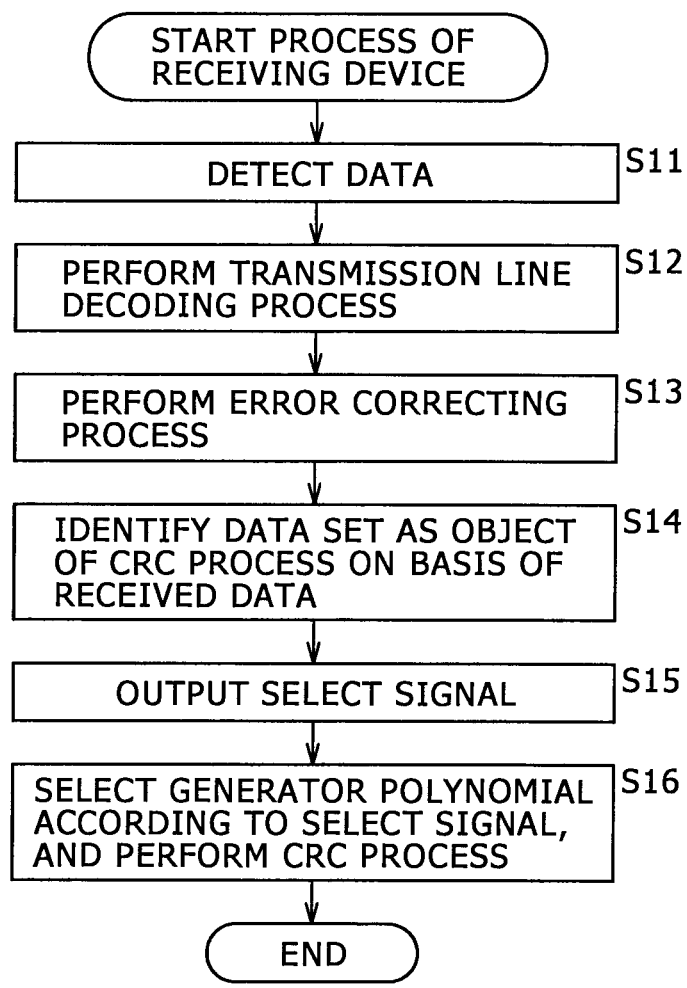
FIG. 13 is a flowchart of assistance in explaining a process of the receiving device.

A process of the receiving device 102 that receives data will next be described with reference to a flowchart of FIG. 13.

In step S11, the code detector 201 detects data on the basis of a received signal, and outputs the detected data to the transmission line decoder 202.

In step S12, the transmission line decoder 202 subjects the data supplied from the code detector 201 to a decoding process according to the transmission line, and outputs resulting data to the error correction decoder 203.

In step S13, the error correction decoder 203 performs an error correcting process on the data supplied from the transmission line decoder 202, and outputs data obtained by performing the error correcting process as received data.

In step S14, the controller 205 identifies the data set as an object of a CRC process in the CRC detector 204 on the basis of the received data supplied from the error correction decoder 203.

In step S15, the controller 205 outputs a select signal specifying a generator polynomial to be used in the CRC process according to the data set as an object of the CRC process to the CRC detector 204.

In step S16, the CRC detector 204 selects the generator polynomial according to the select signal supplied from the controller 205, and performs the CRC process on the received data supplied from the error correction decoder 203. The generator polynomial for header data is used when the CRC process is performed on the header data. The generator polynomial for sub-header data is used when the CRC process is performed on the sub-header data. The CRC detector 204 outputs a coincidence signal indicating a result of the CRC process, and the process is ended.

A highly reliable CRC can be realized by the above processes.

The generator polynomials set in the CRC coder 112 of the transmitting device 101 and the CRC detector 204 of the receiving device 102 will be described in the following.

In the following, for convenience of description, a method of expressing an arrangement of coefficients by a hexadecimal number will be adopted as a method of expressing a generator polynomial $G(x)$. For example, 12D as a hexadecimal number is 100101101 when expressed as a binary number, and thus represents a generator polynomial $G(x)=x^8+x^5+x^3+x^2+1$. In addition, let w be the number of terms of a generator polynomial $G(x)$. Reciprocal polynomials (polynomials in which high-order coefficients and low-order coefficients are reversed) exhibit characteristics identical to each other.

FIG. 14 is a diagram showing candidates for a generator polynomial used in a process performed on data having a code length of 36 bits to 149 bits.

When data of a predetermined code length in a range of 36 bits to 149 bits is subjected to the CRC coding process in the CRC coder 112 of the transmitting device 101 and to the CRC process in the CRC detector 204 of the receiving device 102, a generator polynomial selected from the candidates shown in FIG. 14 is set in the CRC coder 112 and the CRC detector 204.

A first column and a fourth column from the left of FIG. 14 show indexes A1 to A34. A second column and a fifth column show generator polynomials that express an arrangement of coefficients by a hexadecimal number. A third column and a sixth column show the numbers w of terms of the respective generator polynomials.

For example, the generator polynomial $G(x)$ of the index A1 is 13613 ($G(x)=x^{16}+x^{13}+x^{12}+x^{10}+x^9+x^4+x+1$) whose number w of terms is eight. The generator polynomial $G(x)$ of the index A2 is 13D65 ($G(x)=x^{16}+x^{13}+x^{12}+x^{11}+x^{10}+x^8+x^6+x^5+x^2+1$) whose number w of terms is 10.

FIG. 15 is a diagram showing the generator polynomials of FIG. 14 divided into each generator polynomial used in a process performed on data of each code length in the range of 36 bits to 149 bits. A column on the left side of FIG. 15 shows code length n. A column on the right side of FIG. 15 shows the indexes of generator polynomials $G(x)$.

For example, when data of 36 bits is subjected to the CRC coding process in the CRC coder 112 of the transmitting device 101 and to the CRC process in the CRC detector 204 of the receiving device 102, a generator polynomial selected from the candidates of the indexes A6, A25 to A29, and A31 to A34 is set in the CRC coder 112 and the CRC detector 204, as shown in a second row from the top of FIG. 15. Similarly, when data of 37 bits is subjected to the CRC coding process and the CRC process, a generator polynomial selected from the candidates of the indexes A6, A11, A22, and A25 to A34 is set in the CRC coder 112 and the CRC detector 204, as shown in a third row from the top of FIG. 15.

FIG. 16 is a diagram showing candidates for a generator polynomial used in a process performed on data having a code length of 152 bits to 255 bits.

A first column and a fourth column from the left of FIG. 16 show indexes B1 to B15. A second column and a fifth column show generator polynomials that express an arrangement of coefficients by a hexadecimal number. A third column and a sixth column show the numbers w of terms of the respective generator polynomials.

For example, the generator polynomial G(x) of the index B1 is 156F3 ($G(x)=x^{16}+x^{14}+x^{12}+x^{10}+x^9+x^7+x^6+x^5+x^4+x+1$) whose number w of terms is 11. The generator polynomial G(x) of the index B2 is 12109 ($G(x)=x^{16}+x^{13}+x^8+x^3+1$) whose number w of terms is five.

FIG. 17 is a diagram showing the generator polynomials of FIG. 16 divided into each generator polynomial used in a process performed on data of each code length in the range of 152 bits to 255 bits. A column on the left side of FIG. 17 shows code length n. A column on the right side of FIG. 17 shows the indexes of generator polynomials G(x).

For example, when data of a predetermined code length of 152 bits to 170 bits is subjected to the CRC coding process in the CRC coder 112 of the transmitting device 101 and to the CRC process in the CRC detector 204 of the receiving device 102, a generator polynomial selected from the candidates of the indexes B1 to B15 is set in the CRC coder 112 and the CRC detector 204, as shown in a second row from the top of FIG. 17. Similarly, when data of a predetermined code length of 171 bits to 255 bits is subjected to the CRC coding process and the CRC process, a generator polynomial selected from the candidates of the indexes B1 to B10, B14, and B15 is set in the CRC coder 112 and the CRC detector 204, as shown in a third row from the top of FIG. 17.

FIG. 18 is a diagram showing candidates for a generator polynomial used in a process performed on data having a code length of 258 bits to 8001 bits.

A first column and a fourth column from the left of FIG. 18 show indexes C1 to C36. A second column and a fifth column show generator polynomials that express an arrangement of coefficients by a hexadecimal number. A third column and a sixth column show the numbers w of terms of the respective generator polynomials.

For example, the generator polynomial G(x) of the index C1 is 1941F ($G(x)=x^{16}+x^{15}+x^{12}+x^{10}+x^4+x^3+x^2+x+1$) whose number w of terms is nine. The generator polynomial G(x) of the index C2 is 16087 ($G(x)=x^{16}+x^{14}+x^{13}+x^7+x^2+x+1$) whose number w of terms is seven.

FIG. 19 is a diagram showing the generator polynomials of FIG. 18 divided into each generator polynomial used in a process performed on data of each code length in the range of 258 bits to 8001 bits. A column on the left side of FIG. 19 shows code length n. A column on the right side of FIG. 19 shows the indexes of generator polynomials G(x).

For example, when data of a predetermined code length of 258 bits to 595 bits is subjected to the CRC coding process in the CRC coder 112 of the transmitting device 101 and to the CRC process in the CRC detector 204 of the receiving device 102, a generator polynomial selected from the candidates of the indexes C1 to C35 is set in the CRC coder 112 and the CRC detector 204, as shown in a second row from the top of FIG. 19. Similarly, when data of a predetermined code length of 596 bits to 600 bits is subjected to the CRC coding process and the CRC process, a generator polynomial selected from the candidates of the indexes C1 to C7 and C9 to C35 is set in the CRC coder 112 and the CRC detector 204, as shown in a third row from the top of FIG. 19.

FIG. 20 is a diagram showing results of calculation of undetected error probability when generator polynomials selected from the candidates as described above are used.

FIG. 20 shows results of calculation of undetected error probability when 171E7 ($G_1(x)=x^{16}+x^{14}+x^{13}+x^{12}+x^8+x^7+x^6+x^5+x^2+x+1$) of the index B4 is selected as a generator polynomial for header data having a code length of 176 bits from the candidates of the indexes B1 to B10, B14, and B15 shown in the third row from the top of FIG. 17, 11A3D ($G_2(x)=x^{16}+x^{12}+x^{11}+x^9+x^5+x^4+x^3+x^2+1$) of the index C3 is selected as a generator polynomial for sub-header data having a code length of 656 bits from the candidates of the indexes C1 to C4, C7, C10, C13, and C15 to C35 shown in the ninth row from the top of FIG. 19, and a 16-bit CRC (16-bit CRC parity) is generated or checked. That is, FIG. 20 shows results when the generator polynomials $G_1(x)$ and $G_2(x)$ are selected and used by the circuits of FIG. 9 and FIG. 11. An undetected error probability when CRC-CCITT ($G(x)=x^{16}+x^{12}+x^5+1$) is used is also shown for comparison.

As shown in FIG. 20, when CRC-CCITT ($G(x)=x^{16}+x^{12}+x^5+1$) is used as a generator polynomial to perform the CRC coding process and the CRC process on header data having a code length of 176 bits, the undetected error probability is $1.56\times10^{-13}$, whereas when 171E7 ($G_1(x)=x^{16}+x^{14}+x^{13}+x^{12}+x^8+x^7+x^6+x^5+x^2+x+1$) is used, the undetected error probability is $1.99\times10^{-16}$.

In addition, when CRC-CCITT ($G(x)=x^{16}+x^{12}+x^5+1$) is used as a generator polynomial to perform the CRC coding process and the CRC process on sub-header data having a code length of 656 bits, the undetected error probability is $2.17\times10^{-11}$, whereas when 11A3D ($G_2(x)=x^{16}+x^{12}+x^{11}+x^9+x^5+x^4+x^3+x^2+1$) is used, the undetected error probability is $1.05\times10^{-11}$.

Figure 6:
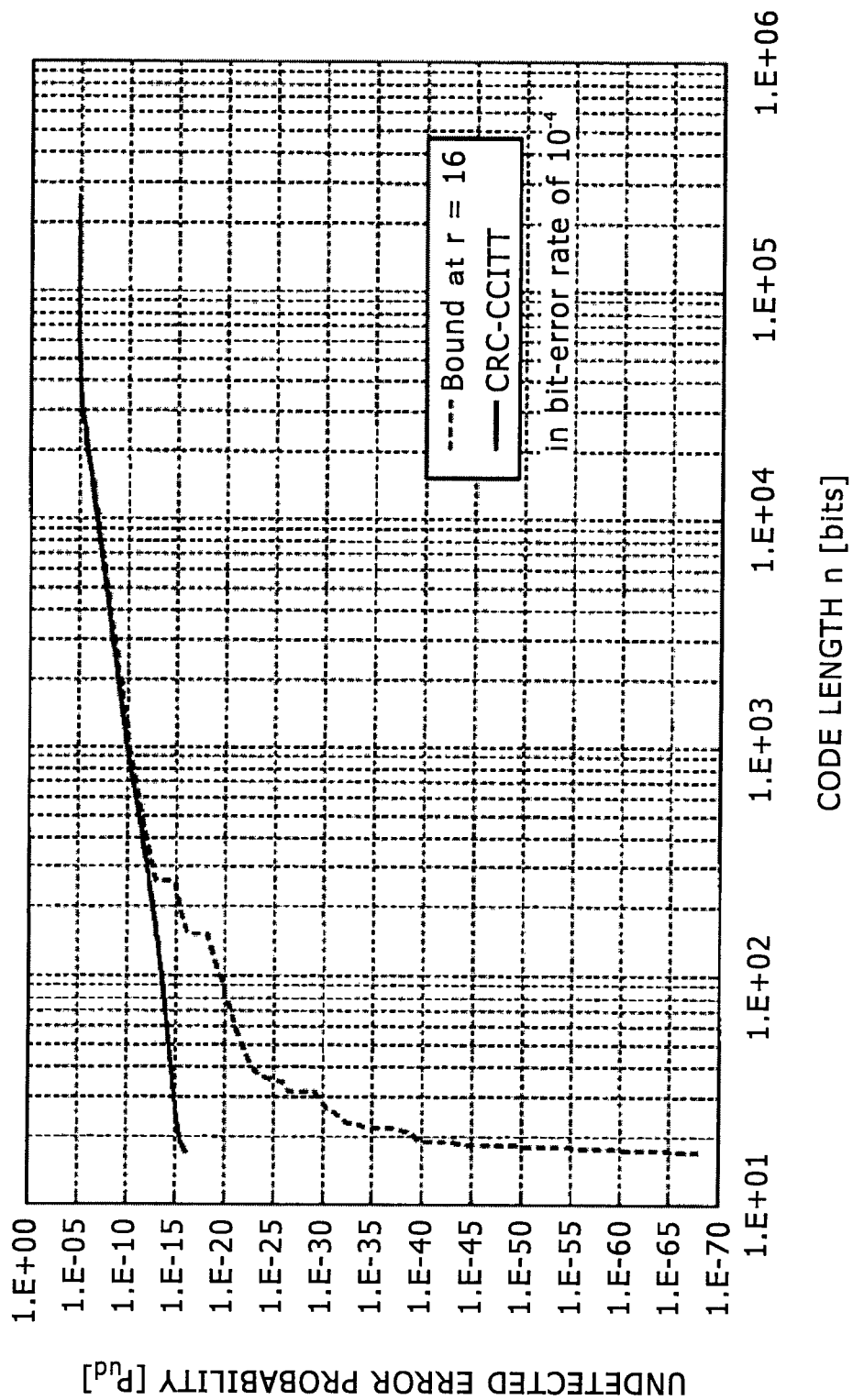
FIG. 6 is a diagram showing an example of a result of calculation of undetected error probability.

When either of header data and sub-header data is set as an object, the undetected error probability of the generator polynomial selected from the above-described candidates is lower, and the probability is close to a theoretical limit value shown in FIG. 6.

Thus, CRC accuracy can be improved to the vicinity of a theoretical limit value by setting a generator polynomial selected from the candidates in FIG. 16 as a generator polynomial to be used to perform the CRC coding process and the CRC process on header data having a code length of 176 bits and a generator polynomial selected from the candidates in FIG. 18 as a generator polynomial to be used to perform the CRC coding process and the CRC process on sub-header data having a code length of 656 bits, and selecting and using the generator polynomials according to object data.

It is to be noted that while in this case, 171E7 of the index B4 is selected as a generator polynomial for header data from the candidates in FIG. 16 and 11A3D of the index C3 is selected as a generator polynomial for sub-header data from the candidates in FIG. 18, the combination of the generator polynomials is arbitrary.

In addition, it is assumed in the above that two generator polynomials are selected for a case where header data is set as an object and a case where sub-header data is set as an object. However, when there is further data having respective different code lengths which data is set as an object of the CRC coding process or the CRC process, a generator polynomial for each piece of data may be set in the transmitting device 101 and the receiving device 102 in advance, and these generator polynomials may be selected.

Figure 21:
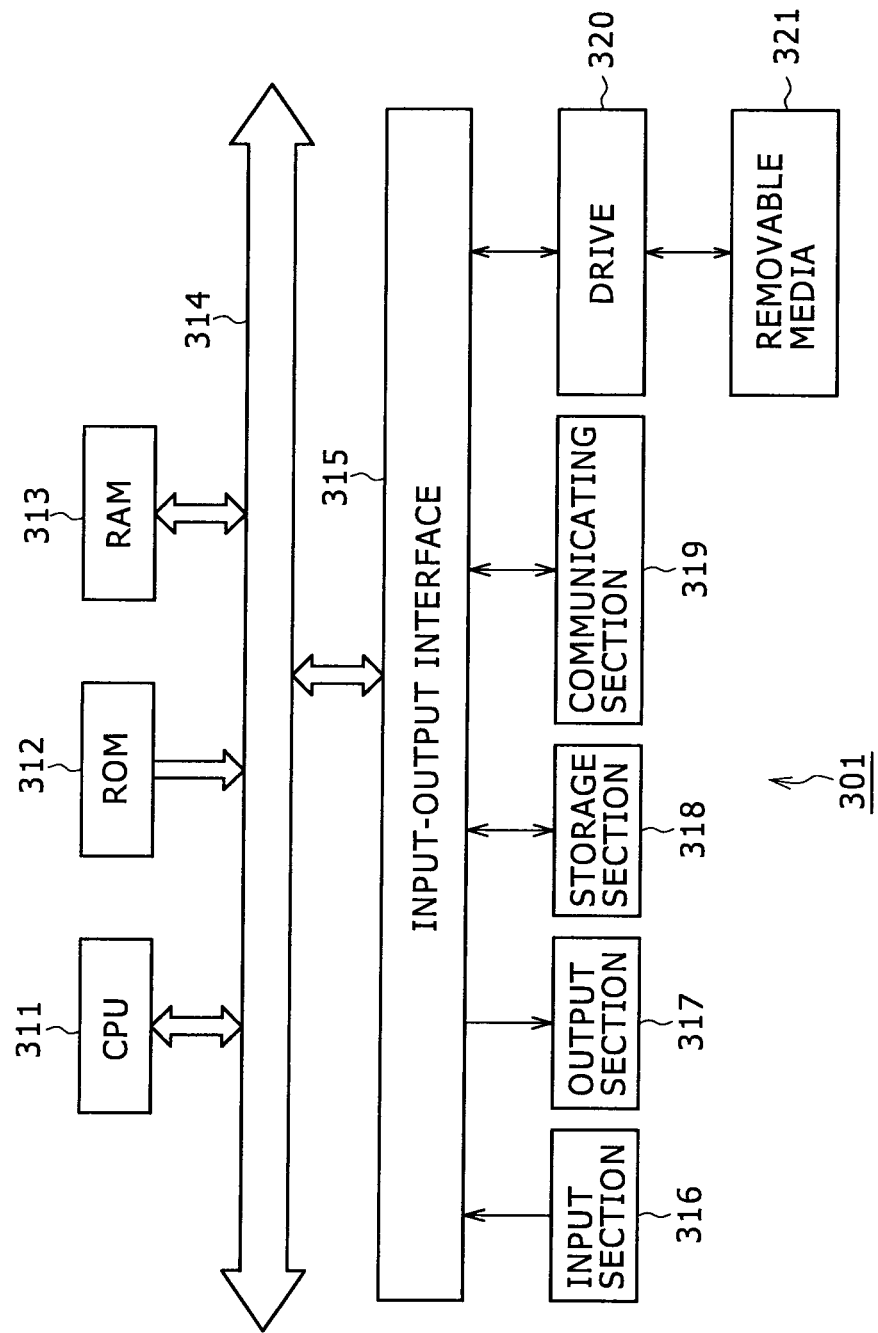
FIG. 21 is a block diagram showing an example of configuration of an information processing device.

FIG. 21 is a block diagram showing an example of configuration of an information processing device 301 for selecting the generator polynomials as described above.

The information processing device 301 is for example a personal computer. A CPU (Central Processing Unit) 311, a ROM (Read Only Memory) 312, and a RAM (Random Access Memory) 313 are interconnected by a bus 314.

The bus 314 is further connected with an input-output interface 315. The input-output interface 315 is connected with an input section 316 formed by a keyboard, a mouse, and the like, an output section 317 formed by a display and the like, a storage section 318 formed by a hard disk and a nonvolatile memory, a communicating section 319 formed by a network interface and the like, and a drive 320 for driving removable media 321 such as an optical disk, a semiconductor memory and the like.

In the information processing device 301 configured as described above, the CPU 311 for example loads a program stored in the storage section 318 into the RAM 313 via the input-output interface 315 and the bus 314, and then executes the program. Thereby a process of selecting a generator polynomial is performed.

A process of the information processing device 301 for selecting generator polynomials will next be described with reference to a flowchart of FIG. 22. This process is basically a similar process to the generator polynomial selecting process described in Japanese Patent Application No. 2004-370796 (Japanese Patent Laid-Open No. 2006-180172 (Patent Document 2)) by the present applicant.

Specifically, in step S51, the CPU 311 of the information processing device 301 extracts generator polynomials satisfying a condition Minimum Hamming Distance $d_{min}$=Maximum Value Max·$d_{min}$ of Minimum Hamming Distance at code length n by a global search. The minimum Hamming distance $d_{min}$ differs according to the generator polynomial. The greater the value of the minimum Hamming distance $d_{min}$, the higher the random error detecting performance, and the lower the undetected error probability. The maximum value Max·$d_{min}$ of the minimum Hamming distance is a value changing according to code length n, as is also described in Patent Document 2. Details of the extracting process performed in step S51 will be described later with reference to a flowchart of FIG. 23.

In step S52, the CPU 311 selects for example ten generator polynomials in increasing order of undetected error probability $P_{ud}$ from the generator polynomials extracted in step S51, and the process is ended. The generator polynomials selected in step S52 are generator polynomial candidates as shown in FIG. 14, FIG. 16, and FIG. 18.

The extracting process performed in step S51 in FIG. 22 will next be described with reference to a flowchart of FIG. 23.

In step S61, the CPU 311 generates a generator polynomial candidate G'(x) at code length n.

In step S62, the CPU 311 determines whether the generator polynomial candidate G'(x) is a reciprocal polynomial of an already retrieved generator polynomial, that is, a generator polynomial used as an object of the process in step S63 and subsequent steps.

When the CPU 311 determines in step S62 that the generator polynomial candidate G'(x) is a reciprocal polynomial of an already retrieved generator polynomial, the CPU 311 returns to step S61 to generate a different generator polynomial candidate G'(x) and perform a similar process. A generator polynomial and a reciprocal polynomial of the generator polynomial have same performance in terms of undetected error probability and the like. Therefore the subsequent process is not performed on a generator polynomial candidate G'(x) having same performance as an already retrieved generator polynomial.

When the CPU 311 determines in step S62 that the generator polynomial candidate G'(x) is not a reciprocal polynomial of an already retrieved generator polynomial, on the other hand, the CPU 311 in step S63 determines whether the number w of terms of the generator polynomial candidate G'(x) is less than a maximum value Max·$d_{min}$ of a minimum Hamming distance.

When the CPU 311 determines in step S63 that the number w of terms of the generator polynomial candidate G'(x) is less than the maximum value Max·$d_{min}$ of the minimum Hamming distance, the CPU 311 returns to step S61 to generate a different generator polynomial candidate G'(x) and perform a similar process. As described above, the maximum value Max·$d_{min}$ of the minimum Hamming distance is a value changing according to code length n. The number w of terms being smaller than this value means that the minimum Hamming distance $d_{min}$ of the generator polynomial candidate G'(x) to which attention is now directed is smaller than the maximum value Max·$d_{min}$ of the minimum Hamming distance, and that the generator polynomial candidate G'(x) is not a generator polynomial satisfying the condition Minimum Hamming Distance $d_{min}$=Maximum Value Max·$d_{min}$ of Minimum Hamming Distance which generator polynomial is to be retrieved in this process. A value of m or more is necessary as the number w of terms in order to achieve a minimum Hamming distance $d_{min}$=M.

When the CPU 311 determines in step S63 that the number w of terms of the generator polynomial candidate G'(x) is not less than the maximum value Max·$d_{min}$ of the minimum Hamming distance, on the other hand, the CPU 311 in step S64 obtains weight distribution B of dual code of the generator polynomial candidate G'(x), which weight distribution B is used in the above Equation (5). The weight distribution B is disclosed in Non-Patent Document 1, as described above.

In step S65, the CPU 311 obtains the minimum Hamming distance $d_{min}$ of the generator polynomial candidate G'(x).

In step S66, the CPU 311 determines whether the obtained minimum Hamming distance $d_{min}$ is less than the maximum value Max·$d_{min}$ of the minimum Hamming distance.

When the CPU 311 determines in step S66 that the minimum Hamming distance $d_{min}$ is less than the maximum value Max·$d_{min}$ of the minimum Hamming distance, the CPU 311 returns to step S61 to generate a different generator polynomial candidate G'(x) and perform a similar process.

When the CPU 311 determines in step S66 that the minimum Hamming distance $d_{min}$ is not less than the maximum value Max·$d_{min}$ of the minimum Hamming distance, that is, when the CPU 311 determines in step S66 that the generator polynomial candidate G'(x) to which attention is directed now is a generator polynomial satisfying the condition Minimum Hamming Distance $d_{min}$=Maximum Value Max·$d_{min}$ of Minimum Hamming Distance, on the other hand, the CPU 311 in step S67 obtains undetected error probability $P_{ud}$ according to the above Equation (5). The undetected error probability $P_{ud}$ may be obtained according to the above Equation (4).

In step S68, the CPU 311 determines whether there is another generator polynomial candidate G'(x) not yet set as an object of search.

When the CPU 311 determines in step S68 that there is another generator polynomial candidate G'(x) not yet set as an object of search as described above, the CPU 311 returns to step S61 to generate a different generator polynomial candidate G'(x) and perform a similar process.

Figure 22:
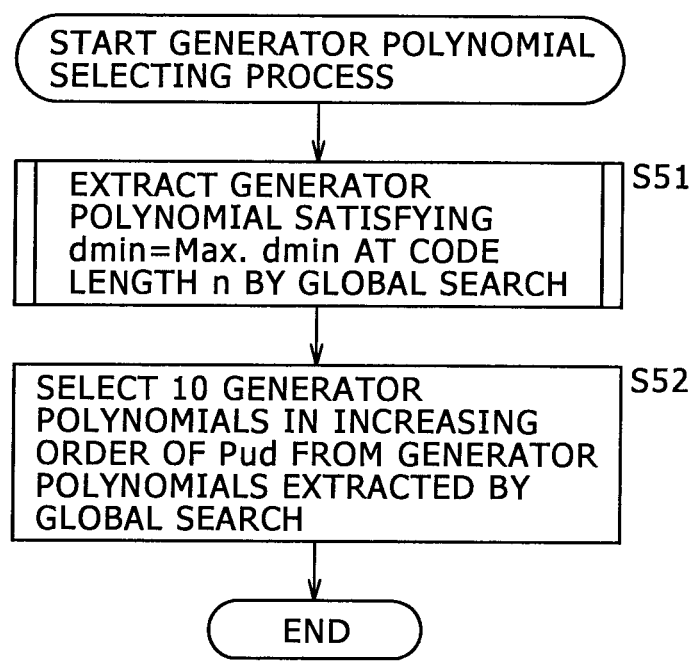
FIG. 22 is a flowchart of assistance in explaining a process for selecting generator polynomials in the information processing device.
Figure 23:
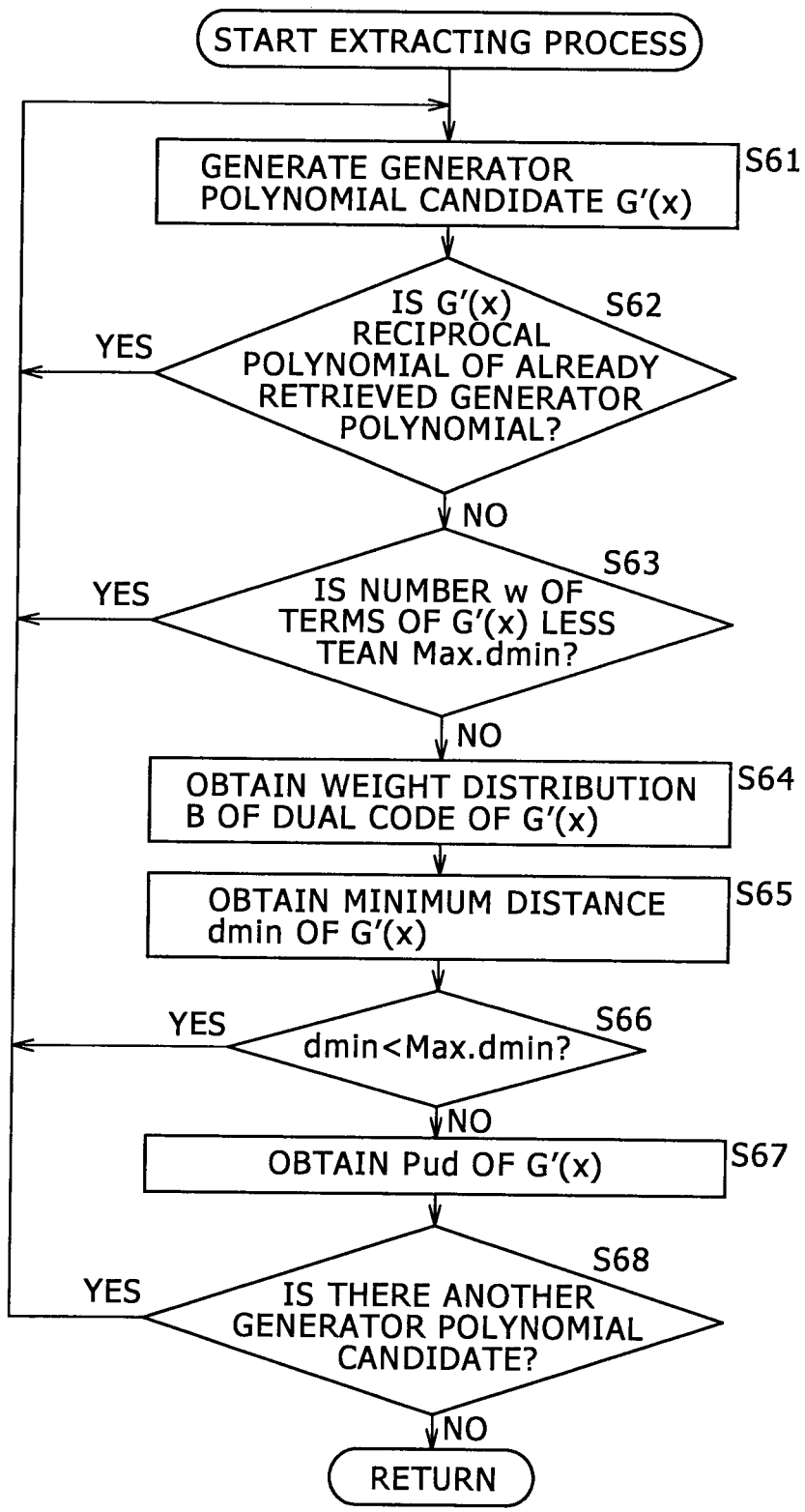
FIG. 23 is a flowchart of assistance in explaining an extracting process performed in step S51 in FIG. 22.

When the CPU 311 determines in step S68 that there is no generator polynomial candidate G'(x) because search as described above has been performed with all generator polynomial candidates G'(x) set as an object, on the other hand, the CPU 311 returns to step S51 in FIG. 22 to perform the subsequent process.

The series of processes described above can be carried out not only by hardware but also by software. When the series of processes is to be carried out by software, a program constituting the software is installed from a program recording medium onto a computer incorporated in dedicated hardware or for example a general-purpose personal computer that can perform various functions by installing various programs thereon.

The program executed by the CPU 311 is for example provided in a state of being recorded on the removable media 321 or provided via a wire or wireless transmission medium such as a local area network, the Internet, digital broadcasting or the like, and installed into the storage section 318.

It is to be noted that the program executed by the computer may be a program in which processing is performed in time series in the order described in the present specification or may be a program in which processing is performed in parallel or in necessary timing such as at a time of a call being made, for example.

Embodiments of the present invention are not limited to the foregoing embodiments, and various changes can be made without departing from the spirit of the present invention.

Description of Reference Numerals

101 Transmitting device, 102 Receiving device, 111 Controller, 112 CRC coder, 113 Error correction coder, 114 Transmission line coder, 201 Code detector, 202 Transmission line decoder, 203 Error correction decoder, 204 CRC detector, and 205 Controller.

The invention claimed is:

1. A transmitting device comprising:
   a CRC coder for selecting a first generator polynomial for header data according to a code length of the header data and a second generator polynomial for sub-header data according to a code length of the sub-header data, wherein the first generator polynomial is different from the second generator polynomial; and
   a transmission line coder for transmitting data resulting from the CRC coding process performed by the CRC coder,
   wherein the first generator polynomial is selected from a plurality of available generator polynomial candidates,
   wherein the first generator polynomial has a minimum Hamming distance that is equal to a maximum value of the minimum Hamming distance at the code length of the header data, and
   wherein each of the available generator polynomial candidates of the plurality of available generator polynomial candidates satisfy a condition of minimum Hamming distance being equal to maximum value of minimum Hamming distance at the code length of the header data.

2. The transmitting device of claim 1, wherein a number of terms of the first generator polynomial is selected to minimize an undetected error probability characteristic as a result of the CRC coding performed on the header data.

3. The transmitting device of claim 1,
   wherein the second generator polynomial is selected from a second plurality of available generator polynomial candidates,
   wherein of the second generator polynomial has a minimum Hamming distance that is equal to a maximum value of the minimum Hamming distance at the code length of the sub-header data, and
   wherein each of the available generator polynomial candidates of the second plurality of available generator polynomial candidates satisfy a condition of minimum Hamming distance being equal to maximum value of minimum Hamming distance at the code length of the sub-header data.

4. The transmitting device of claim 3, wherein a number of terms of the second generator polynomial is selected to minimize an undetected error probability characteristic as a result of the CRC coding performed on the sub-header data.

5. A transmitting method of a transmitting device, the transmitting device having a plurality of generator polynomials for a CRC coding process performed on header data and sub-header data having different lengths, the transmitting method comprising the steps of:
   selecting a first generator polynomial for header data according to a code length of the header data and a second generator polynomial for sub-header data according to a code length of the sub-header data, wherein the first generator polynomial is different from the second generator polynomial; and
   transmitting data resulting from the CRC coding process,
   wherein the first generator polynomial is selected from a plurality of available generator polynomial candidates,
   wherein the first generator polynomial has a minimum Hamming distance that is equal to a maximum value of the minimum Hamming distance at the code length of the header data, and
   wherein each of the available generator polynomial candidates of the plurality of available generator polynomial candidates satisfy a condition of minimum Hamming distance being equal to maximum value of minimum Hamming distance at the code length of the header data.

6. A non-transitory computer storage medium for storing a program for making a computer perform a process of a transmitting device, the transmitting device having a plurality of generator polynomials for a CRC coding process performed on header data and sub-header data having different lengths, the program comprising the steps of:
   selecting a first generator polynomial for header data according to a code length of the header data and a second generator polynomial for sub-header data according to a code length of the sub-header data, wherein the first generator polynomial is different from the second generator polynomial; and
   transmitting data resulting from the CRC coding process,
   wherein the first generator polynomial is selected from a plurality of available generator polynomial candidates,
   wherein the first generator polynomial has a minimum Hamming distance that is equal to a maximum value of the minimum Hamming distance at the code length of the header data, and
   wherein each of the available generator polynomial candidates of the plurality of available generator polynomial candidates satisfy a condition of minimum Hamming distance being equal to maximum value of minimum Hamming distance at the code length of the header data.

* * * * *